United States Patent
Kawae

(10) Patent No.: US 8,493,766 B2
(45) Date of Patent: Jul. 23, 2013

(54) SEMICONDUCTOR DEVICE AND METHOD OF DRIVING SEMICONDUCTOR DEVICE

(75) Inventor: Daisuke Kawae, Chiba (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 163 days.

(21) Appl. No.: 13/019,334

(22) Filed: Feb. 2, 2011

(65) Prior Publication Data

US 2011/0194327 A1 Aug. 11, 2011

(30) Foreign Application Priority Data

Feb. 5, 2010 (JP) ................................. 2010-024886

(51) Int. Cl.
*G11C 5/06* (2006.01)

(52) U.S. Cl.
USPC ........................................ 365/72; 365/189.05

(58) Field of Classification Search
USPC .............................................. 365/72, 189.05
See application file for complete search history.

(56) References Cited

U.S. PATENT DOCUMENTS

| | | | |
|---|---|---|---|
| 4,398,267 A | 8/1983 | Furuyama | |
| 4,466,081 A | 8/1984 | Masuoka | |
| 5,349,366 A | 9/1994 | Yamazaki et al. | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,373,745 B2 * | 4/2002 | Saito et al. | 365/174 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Michael Tran
(74) *Attorney, Agent, or Firm* — Fish & Richardson P.C.

(57) ABSTRACT

The number of wirings per unit memory cell is reduced by sharing a bit line by a writing transistor and a reading transistor. Data is written by turning on the writing transistor so that a potential of the bit line is supplied to a node where one of a source electrode and a drain electrode of the writing transistor and a gate electrode of the reading transistor are electrically connected, and then turning off the writing transistor so that a predetermined amount of charge is held in the node. Data is read by using a reading signal line connected to one of a source electrode and a drain electrode of the reading transistor so that a predetermined reading potential is supplied to the reading signal line, and then detecting a potential of the bit line.

12 Claims, 17 Drawing Sheets

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,054,121 B2 | 11/2011 | Kato |
| 8,314,637 B2 | 11/2012 | Kato et al. |
| 8,339,828 B2 | 12/2012 | Yamazaki et al. |
| 8,339,836 B2 | 12/2012 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0297220 A1* | 12/2008 | Matsuzaki et al. ............ 327/211 |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2011/0101351 A1 | 5/2011 | Yamazaki |
| 2011/0116329 A1* | 5/2011 | Koike ...................... 365/189.15 |
| 2011/0121878 A1 | 5/2011 | Kato et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175083 A1 | 7/2011 | Sekine et al. |
| 2011/0175087 A1 | 7/2011 | Yamazaki et al. |
| 2011/0175104 A1 | 7/2011 | Yamazaki |
| 2011/0175646 A1 | 7/2011 | Takemura et al. |
| 2011/0176263 A1 | 7/2011 | Yamazaki et al. |
| 2011/0176348 A1 | 7/2011 | Yamazaki et al. |
| 2011/0176355 A1 | 7/2011 | Furutani et al. |
| 2011/0176377 A1 | 7/2011 | Koyama |
| 2011/0182110 A1 | 7/2011 | Yamazaki et al. |
| 2011/0186837 A1 | 8/2011 | Takahashi et al. |
| 2011/0187410 A1 | 8/2011 | Kato et al. |
| 2011/0194331 A1 | 8/2011 | Kawae et al. |
| 2011/0194332 A1 | 8/2011 | Saito |
| 2011/0198593 A1 | 8/2011 | Kato et al. |

FOREIGN PATENT DOCUMENTS

| | | |
|---|---|---|
| JP | 50-067531 A | 6/1975 |
| JP | 56-083060 A | 7/1981 |
| JP | 56-083886 A | 7/1981 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-298889 A | 12/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th Internatioal Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2011/050908, dated Apr. 26, 2011, 3 pages.

Written Opinion, PCT Application No. PCT/JP2011/050908, dated Apr. 26, 2011, 5 pages.

Asakuma, N et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 2, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic NANO-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C." Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C." Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector with Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS with a Novel Passivation Layer," SID Digest '09 : SID International Symposium Digest of Technical Papers, May 31, 2009, pp. 284-287.

* cited by examiner

SEMICONDUCTOR DEVICE AND METHOD OF DRIVING SEMICONDUCTOR DEVICE

TECHNICAL FIELD

The invention disclosed herein relates to a semiconductor device using a semiconductor element and a method of driving the semiconductor device.

BACKGROUND ART

Memory devices using semiconductor elements are broadly classified into two categories: volatile memory devices that lose memory data when power supply stops, and non-volatile memory devices that store memory data even when power supply stops.

A typical example of a volatile memory device is a DRAM (dynamic random access memory). A DRAM stores data in such a manner that a transistor included in a memory element is selected and charge is held in a capacitor.

When data is read from a DRAM, charge in a capacitor is lost on the above-described principle; thus, another writing operation is necessary whenever data is read out. Moreover, a transistor included in a memory element has leakage current and charge flows into or out of a capacitor even when the transistor is not selected, so that a data (information) storing time is short. For that reason, another writing operation (refresh operation) is necessary at predetermined intervals, and it is difficult to reduce power consumption sufficiently. Furthermore, since memory data is lost when power supply stops, an additional memory device using a magnetic material or an optical material is needed in order to store the data for a long time.

Another example of a volatile memory device is an SRAM (static random access memory). An SRAM stores memory data by using a circuit such as a flip-flop and thus does not need a refresh operation. This means that an SRAM has an advantage over a DRAM. However, cost per memory capacity is increased because a circuit such as a flip-flop is used. Moreover, as in a DRAM, memory data in an SRAM is lost when power supply stops.

A typical example of a non-volatile memory device is a flash memory. A flash memory includes a floating gate between a gate electrode and a channel formation region in a transistor and stores data by holding of charge in the floating gate. Therefore, a flash memory has advantages in that a data storing time is extremely long (almost permanent) and a refresh operation which is necessary in a volatile memory device is not needed (e.g., see Patent Document 1).

However, a gate insulating layer included in a memory element deteriorates by tunneling current which flows in writing, so that the memory element stops its function after a predetermined number of writing operations. In order to reduce adverse effects of this problem, a method in which the number of writing operations for memory elements is equalized is employed, for example. However, complicated supplemental circuits are additionally needed to realize this method. Moreover, employing such a method does not solve the fundamental problem of lifetime. In other words, a flash memory is not suitable for applications in which data is frequently rewritten.

In addition, high voltage is necessary for holding of charge in the floating gate or removal of the charge, and a circuit for generating high voltage is also necessary. Further, it takes a relatively long time to hold or remove charge, and it is not easy to perform writing and erasing at higher speed.

REFERENCE

Patent Document

[Patent Document 1] Japanese Published Patent Application No. S57-105889

DISCLOSURE OF INVENTION

In view of the foregoing problems, an object of one embodiment of the disclosed invention is to provide a semiconductor device with a novel structure, in which memory data can be stored even when power is not supplied and in which there is no limitation on the number of times of writing.

It is another object to provide a semiconductor device with higher integration and larger memory capacity.

It is another object to provide a highly reliable semiconductor device with stable operation.

It is another object to provide a semiconductor device capable of high-speed operation.

It is another object to provide a semiconductor device which consumes low power.

One embodiment of the invention disclosed in this specification achieves at least one of the above objects.

One embodiment of the present invention is a semiconductor device comprising a nonvolatile memory cell, a reading signal line, a bit line, and a word line. The nonvolatile memory cell includes a reading transistor and a writing transistor including an oxide semiconductor. In the semiconductor device, one of a source electrode and a drain electrode of the reading transistor is electrically connected to the reading signal line, and one of a source electrode and a drain electrode of the writing transistor is electrically connected to a gate electrode of the reading transistor. Further, the other of the source electrode and the drain electrode of the reading transistor and the other of the source electrode and the drain electrode of the writing transistor are electrically connected to the bit line, and a gate electrode of the writing transistor is electrically connected to the word line.

Another embodiment of the present invention is a semiconductor device comprising a nonvolatile memory cell, a first wiring, a second wiring, and a third wiring. The nonvolatile memory cell includes a first transistor and a second transistor. In the semiconductor device, one of a source electrode and a drain electrode of the first transistor is electrically connected to the first wiring, and one of a source electrode and a drain electrode of the second transistor is electrically connected to a gate electrode of the first transistor. Further, the other of the source electrode and the drain electrode of the first transistor and the other of the source electrode and the drain electrode of the second transistor are electrically connected to the second wiring, and a gate electrode of the second transistor is electrically connected to the third wiring.

In any of the semiconductor devices, a transistor including an oxide semiconductor is used as the writing transistor or the second transistor, whereby frequency of refresh operations can be extremely low.

In any of the semiconductor device, the off-state current of the writing transistor or the second transistor is preferably lower than the off-state current of the reading transistor or the first transistor.

In the semiconductor device, the second transistor preferably includes a material having an energy gap larger than 3 eV.

In the semiconductor device, the switching rate of the first transistor is preferably higher than the switching rate of the second transistor.

In the semiconductor device, data writing is performed in the following manner. When the first transistor is in an off state, the second transistor is turned on. Through the second transistor, a high-level potential or a low-level potential of the second wiring is supplied to a node where one of the source electrode and the drain electrode of the second transistor is connected to the gate electrode of the first transistor, and the second transistor is turned off, whereby a predetermined amount of charge is held in the node.

In the semiconductor device, data held in the node is read in the following manner. When the second transistor is in an off state, charge is supplied to the second wiring (this operation is referred to as pre-charge) so that the second wiring has a second potential. Then, a first potential as a reading potential is supplied to the first wiring, and a potential of the second wiring is detected.

Note that in this specification and the like, a nonvolatile semiconductor device refers to a semiconductor device which can store data for a given period of time or longer ($1\times10^4$ seconds or longer, preferably $1\times10^6$ seconds or longer) even when no power is supplied thereto.

Note that in this specification and the like, the term such as "over" or "below" does not necessarily mean that a component is placed "directly on" or "directly under" another component. For example, the expression "a gate electrode over a gate insulating layer" does not exclude the case where a component is placed between the gate insulating layer and the gate electrode. Moreover, the terms such as "over" and "below" are only used for convenience of description and can include the case where the positional relation of components is reversed, unless otherwise specified.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Further, in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

With one embodiment of the present invention, the area of a semiconductor device can be reduced. Thus, a semiconductor device with higher integration and larger memory capacity can be provided.

Since data writing of the present invention does not need high voltage, problems such as deterioration of a gate insulating layer do not easily arise; thus, the number of times data can be rewritten is greatly increased, and reliability is greatly increased.

Furthermore, data is written depending on the on state and the off state of the transistor, and operation for erasing data is not needed, whereby high-speed operation can be easily realized.

A transistor including an oxide semiconductor is used for a memory cell, whereby memory data can be stored for a quite long period of time. In other words, power consumption of the semiconductor device can be reduced because a refresh operation becomes unnecessary or the frequency of refresh operations can be extremely low. Moreover, memory data can be stored for a long time even when power is not supplied.

By using a combination of a transistor including an oxide semiconductor and a transistor including a material other than an oxide semiconductor which can be operated at high speed, various circuits (such as a logic circuit and a driver circuit) which are required to be operated at high speed can be favorably realized.

BEST MODE FOR CARRYING OUT THE INVENTION

Figure 1A:
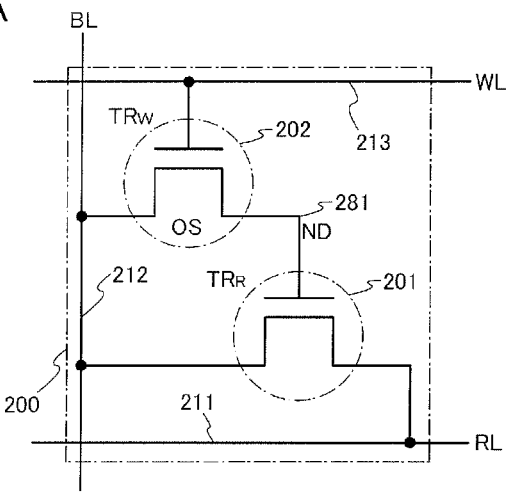
FIGS. 1A and 1B are circuit diagrams of a semiconductor device.

Embodiments of the present invention will be described below with reference to drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiment modes.

A transistor is a kind of semiconductor elements and can achieve amplification of a current or a voltage, a switching operation for controlling conduction or non-conduction, or the like. A transistor in this specification includes an insulated-gate field effect transistor (IGFET) and a thin film transistor (TFT).

Note that for the easy understanding, the position, size, range, and the like of each component illustrated in drawings and the like are not actual ones in some cases. Therefore, the disclosed invention is not necessarily limited to the position, size, range, or the like as disclosed in the drawings and the like. Note that in circuit diagrams, "OS" may be written beside a transistor in order to indicate that the transistor includes an oxide semiconductor.

In this specification and the like, ordinal numbers such as "first", "second", and "third" are used in order to avoid confusion among components, and the terms do not mean limitation of the number of components.

Embodiment 1

In this embodiment, a circuit structure and operation of a semiconductor device which is one embodiment of the disclosed invention will be described with reference to FIGS. 1A and 1B, FIGS. 2A and 2B, and FIG. 3. In this embodiment, the case where n-channel transistors are used will be described.

In FIG. 1A, the circuit structure of the semiconductor device disclosed in this embodiment is illustrated. The semiconductor device illustrated in FIG. 1A includes a nonvolatile memory cell 200 including a first transistor 201 and a second transistor 202. In FIG. 1A, a first wiring 211 (also referred to as a reading signal line RL) and one of a source electrode and a drain electrode of the first transistor 201 (also referred to as a transistor $TR_R$) are electrically connected to each other. One of a source electrode and a drain electrode of the second transistor 202 (also referred to as a transistor $TR_W$) and a gate electrode of the first transistor 201 are electrically connected to each other. A second wiring 212 (also referred to as a bit line BL), the other of the source electrode and the drain electrode of the first transistor 201, and the other of the source electrode and the drain electrode of the second transistor 202 are electrically connected to one another. A third wiring 213 (also referred to as a word line WL) and a gate electrode of the second transistor 202 are electrically connected to each other. The first transistor 201 functions as a reading transistor, and the second transistor 202 functions as a writing transistor. The semiconductor device illustrated in FIG. 1A is a three-terminal semiconductor device in which three wirings are connected to one memory cell.

The off-state current of the second transistor 202, which is the writing transistor, is 100 zA ($1\times10^{-19}$ A) or less, preferably 10 zA ($1\times10^{-20}$ A) or less, more preferably 1 zA ($1\times10^{-21}$ A) or less at an ambient temperature (e.g., 25° C.). Although such a low off-state current is difficult to achieve with a transistor including a general silicon semiconductor, it can be achieved with a transistor including an oxide semiconductor that is processed under an appropriate condition and has a large energy gap of 3.0 eV to 3.5 eV. Therefore, the transistor including the oxide semiconductor is preferably used as the writing transistor.

Further, by using the transistor including the oxide semiconductor as the writing transistor, rising of a writing pulse to the memory cell can be extremely sharp due to a small subthreshold swing (S value).

In this embodiment, as the second transistor 202, which is the writing transistor, the transistor including the oxide semiconductor is used. The transistor including the oxide semiconductor has a characteristic of an extremely low leakage current (off-state current) between a source and a drain in an off state. Therefore, by turning off the second transistor 202, charge in a node 281 (also referred to as a node ND) can be held for a very long time. In the node ND, the one of the source electrode and the drain electrode of the second transistor 202 and the gate electrode of the first transistor 201 are electrically connected to each other.

As the first transistor 201, which is the reading transistor, a transistor which is operated at high speed is preferably used in order to increase the reading rate. For example, a transistor with a switching rate of 1 nanosecond or less is preferably used as the reading transistor.

The off-state current of the first transistor 201 does not need to be as low as that of the second transistor 202. A transistor with a higher switching rate (e.g., a transistor with higher field effect mobility) than the second transistor 202 can be used as the first transistor 201 in order to increase operation speed of the memory cell. That is, as the first transistor 201, a transistor including a semiconductor material other than the oxide semiconductor can be used. Note that in some cases, the off-state current of the first transistor 201 is higher than that of the second transistor 202 depending on the semiconductor material selected. As the semiconductor material used for the first transistor 201, for example, silicon, germanium, silicon germanium, silicon carbide, gallium arsenide, or the like can be used. Alternatively, an organic semiconductor material or the like may be used. The first transistor 201 including such a semiconductor material can be operated at sufficiently high speed, so that it can perform reading of stored data at high speed. That is, the semiconductor device can be operated at high speed.

Note that when the second transistor 202 is in an off state, the node 281 can be regarded as being embedded in an insulator (a so-called floating state) and thus holds charge. That is, the node 281 has the same effect as a floating gate of a floating-gate transistor that is used as a nonvolatile memory element. The off-state current of the second transistor 202 including the oxide semiconductor is smaller than or equal to one hundred thousandth of the off-state current of a transistor including a silicon semiconductor or the like; thus, loss of the charge accumulated in the node 281 due to a leakage current of the second transistor 202 is negligible. That is, with the second transistor 202 including the oxide semiconductor, a nonvolatile memory cell can be realized.

As long as the off-state current of the second transistor 202 is substantially 0 for example, a refresh operation needed for a conventional DRAM can be unnecessary or performed much less often (e.g., about once a month or a year). Accordingly, power consumption of the semiconductor device can be reduced sufficiently.

Further, in the semiconductor device disclosed in this embodiment, data can be directly rewritten by rewriting of new data to a memory cell. Therefore, an erasing operation needed for a flash memory or the like is unnecessary, so that a reduction in operation speed due to the erasing operation can be prevented. That is, the semiconductor device can be operated at high speed. In addition, a high voltage needed for writing and erasing operations in a conventional floating gate transistor is unnecessary; thus, power consumption of the semiconductor device can be further reduced.

Next, a writing (rewriting) operation of data to the memory cell 200 will be described. First, a potential of the third wiring 213 (the word line WL) connected to the memory cell 200 which is selected as a memory cell to which data is to be written is set to a potential at which the second transistor 202, which is the writing transistor, is turned on, so that the second transistor 202 is turned on. A high-level potential $V_{WLH}$ is given to the third wiring 213 here. Accordingly, a potential of the second wiring 212 (the bit line BL) connected to the selected memory cell 200 is supplied to the node 281 (the node ND). A low-level potential $V_{BLL}$ or a high-level potential $V_{BLH}$ is supplied here. After that, the potential of the third wiring 213 is set to a potential at which the second transistor 202 is turned off, so that the second transistor 202 is turned off; thus, the node 281 is in a floating state, and predetermined charge remains held in the node 281. In the above-described manner, by accumulating and holding a predetermined amount of charge in the node 281, the memory cell 200 can store data (a writing mode).

It is important that the first transistor 201, which is the reading transistor, is kept in an off state throughout the writing operation. If the first transistor 201 is turned on when $V_{BLH}$ or $V_{BLL}$ is supplied to the node 281, the second wiring 212 and the first wiring 211 (reading signal line RL) are brought into conduction via the first transistor 201. Accordingly, potentials of the second wiring 212 and the first wiring 211 interfere with each other, and accurate data cannot be given to the node 281.

The low-level potential $V_{RLL}$ or a high-level potential $V_{RLH}$ is supplied to the first wiring 211. Throughout the writing operation, the first wiring 211 is kept supplied with the high-level potential $V_{RLH}$. When the threshold voltage of the first transistor 201 is represented as $V_{th1}$, in order to keep the off state of the first transistor 201 in the writing operation, $V_{BLH}$, $V_{RLH}$, and $V_{th1}$ are set so as to satisfy Formula 1.

$$V_{BLH} - V_{RLH} < V_{th1} \qquad \text{[Formula 1]}$$

In some cases, $V_{BLH}$ is held in a node 281 of a non-selected memory cell. In those cases, in order to select another memory cell which shares the second wiring 212 with the non-selected memory cell and supply $V_{BLL}$ to the selected memory cell, $V_{BLL}$ is supplied to the second wiring 212. At this time, in order to keep the off state of the first transistor 201 of the non-selected memory cell, $V_{BLH}$, $V_{BLL}$, and $V_{th1}$ are set so as to satisfy Formula 2. Formula 2 shows that a difference between the high-level potential and the low-level potential supplied to the bit line needs to be smaller than the threshold voltage of the first transistor 201.

$$V_{BLH} - V_{BLL} < V_{th1} \qquad \text{[Formula 2]}$$

In the semiconductor device described in this embodiment, charge travel in a gate insulating film (a tunnel insulating film) is not caused in the writing (rewriting) operation unlike a floating-gate transistor, but the charge travel is caused by a switching operation of the second transistor 202. Therefore, there is no limitation on the number of the writing operations in principle, and the resistance to rewriting is extremely high. In addition, a high voltage needed for writing and erasing in the floating-gate transistor is unnecessary; thus, power consumption of the semiconductor device can be reduced.

Next, a reading operation in which data stored in a memory cell is read is described. First, the potential of the third wiring 213 is set to a potential at which the second transistor 202, which is the writing transistor, is turned off, so that the second transistor 202 is turned off. A low-level potential $V_{WLL}$ is supplied to the third wiring 213 here. Next, charge is given (precharging) to the second wiring 212, so that the potential of the second wiring 212 is $V_{BLH}$. Then, a low-level potential $V_{RLL}$ is supplied as a reading potential to the first wiring 211 of a memory cell from which data is to be read, and the potential of the second wiring 212 at this time is detected, so that data stored in the memory cell can be read (a reading mode). Note that the potential supplied to the second wiring 212 by the precharging is not limited to the above potential as long as the difference between the potential and a potential held in the node 281 is smaller than $V_{th1}$ and the potential is different from the reading potential.

The low-level potential $V_{RLL}$ of the first wiring 211 is set so as to satisfy Formula 3 and Formula 4.

$$V_{BLH} - V_{RLL} > V_{th1} \qquad \text{[Formula 3]}$$

$$V_{RLL} - V_{RLL} < V_{th1} \qquad \text{[Formula 4]}$$

That is, Formula 3 shows that when $V_{RLL}$ is supplied to the first wiring 211 in the case where $V_{BLH}$ is held in the node 281, a potential difference between the gate electrode of the first transistor 201 and the one of the source electrode and the drain electrode of the first transistor 201 to which the first wiring 211 is connected is larger than the threshold voltage, so that the first transistor 201 is turned on. When the first transistor 201 is turned on, the low-level potential $V_{RLL}$ of the first wiring 211 is supplied to the second wiring 212 via the first transistor 201.

In addition, Formula 4 shows that even when $V_{RLL}$ is supplied to the first wiring 211 in the case where $V_{BLL}$ is held in the node 281, a potential difference between the gate electrode of the first transistor 201 and the one of the source electrode and the drain electrode of the first transistor 201 to which the first wiring 211 is connected is smaller than the threshold voltage, so that the first transistor 201 remains in an off state. That is, the potential of the second wiring 212 remains to be the precharged potential ($V_{BLH}$ here).

From Formula 3 and Formula 4, the low-level potential $V_{RLL}$, which is the reading potential, can be set in a range satisfying Formula 5.

$$V_{BLL} - V_{th1} < V_{RLL} < V_{BLH} - V_{th1} \qquad \text{[Formula 5]}$$

In addition, the reading potential $V_{RLL}$ is preferably set so as to satisfy Formula 6.

$$V_{RLL} = (V_{BLH} + V_{BLL})/2 - V_{th1} \qquad \text{[Formula 6]}$$

The third wiring 213 (the word line WL) is supplied with the high-level potential $V_{WLH}$ at which the second transistor 202 is turned on or the low-level potential $V_{WLL}$ at which the second transistor 202 is turned off. When the threshold voltage of the second transistor 202 is represented as $V_{th2}$, the high-level potential $V_{WLH}$ and the low-level potential $V_{WLL}$ are set so as to satisfy Formula 7 and Formula 8, respectively.

$$V_{WLH} > V_{th2} + V_{BLH} \qquad \text{[Formula 7]}$$

$$V_{WLL} < V_{th2} + V_{BLL} \qquad \text{[Formula 8]}$$

Note that when the low-level potential $V_{RLL}$ is supplied to the first wiring 211 in the reading mode, among other memory cells connected to the first wiring 211, a first transistor 201 of a memory cell in which a node 281 has $V_{BLH}$ is also turned on; however, the node 281 is in a floating state, so that charge held in the node 281 remains held.

Figures 2A, 2B:
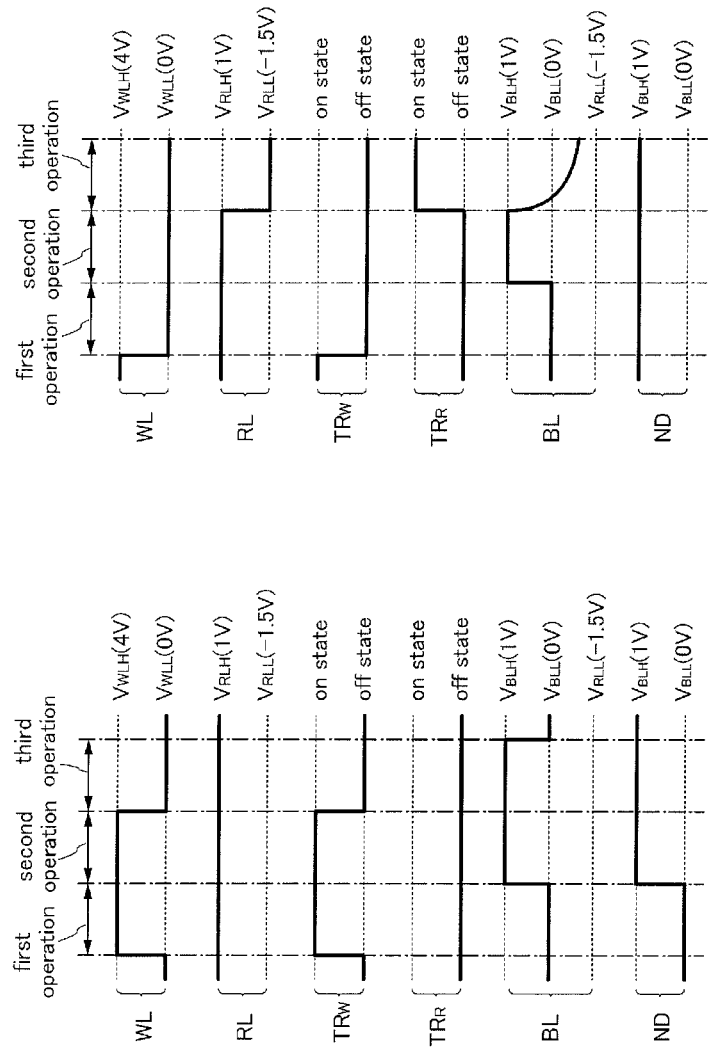
FIGS. 2A and 2B are timing charts relating to operation of a semiconductor device.

Here, operation of the above-described three-terminal semiconductor device in the writing mode and the reading mode is more specifically described with reference to timing charts in FIGS. 2A and 2B. The timing charts in FIGS. 2A and 2B show change of potentials or states of each portion in the charts over time. In FIGS. 2A and 2B, shown are examples in each of which the threshold voltage of each of the $TR_W$ and $TR_R$ is 2 V, the potential $V_{WLH}$ is 4 V, the potential $V_{WLL}$ is 0 V, the potential $V_{BLH}$ is 1 V, the potential $V_{BLL}$ is 0 V, the potential $V_{RLH}$ is 1 V, the potential $V_{RLL}$ is −1.5 V, and a precharge voltage that is applied to the bit line in the reading mode is $V_{BLH}$.

FIG. 2A is a timing chart for describing the operation in the writing mode. Here, operation for holding the high-level potential $V_{BLH}$ in the node ND is described. First, as first operation, a potential of the word line WL is set to $V_{WLH}$, so that the transistor $TR_W$ is turned on. Next, as second operation, a potential of the bit line BL is set to $V_{BLH}$, so that $V_{BLH}$ is supplied to the node ND via the transistor $TR_W$. Then, as third operation, the potential of the word line WL is set to $V_{WLL}$, so that the transistor $TR_W$ is turned off. The charge supplied to the node ND is held after the transistor $TR_W$ is turned off.

Note that an accurate potential might not be held in the node ND in the case where the potential of the bit line BL varies before the transistor $TR_W$ is turned off. In the case where the potential of the bit line BL is made to vary, the variation needs to be performed after the transistor $TR_W$ is turned off. Even when the potential of the bit line BL varies after the third operation, the charge held in the node ND remains held.

Note that the first operation and the second operation can be performed in the reverse order.

Throughout the writing mode, the potential of the reading signal line RL is kept to be $V_{RLH}$, so that the transistor $TR_R$ is kept in an off state. Since $V_{RLH}$ is 1 V, the potential $V_{BLH}$ is 1 V, and the potential $V_{BLL}$ is 0 V here, Formula 1 is satisfied and the transistor $TR_R$ remains in an off state.

Note that the operation for holding the low-level potential $V_{BLL}$ in the node ND can be described by replacing $V_{BLH}$ with $V_{BLL}$ in FIG. 2A.

FIG. 2B is a timing chart for describing the operation in the reading mode. Here, operation of the case where the high-level potential $V_{BLH}$ is held in the node ND is described. First, as first operation, the potential of the word line WL is set to $V_{WLL}$, so that the transistor $TR_W$ is turned off. Next, as second operation, charge is given (precharging) to the bit line BL, so that the potential of the bit line BL is different from $V_{RLL}$. In this embodiment, the bit line BL is precharged to have the potential $V_{BLH}$ (1 V). Then, as third operation, the potential of the reading signal line RL is set to $V_{RLL}$. Since the potential $V_{BLH}$ is 1 V and the potential $V_{RLL}$ is −1.5 V, Formula 3 is satisfied and the transistor $TR_R$ is turned on. When the transistor $TR_R$ is in an on state, $V_{RLL}$ is supplied to the bit line BL via the transistor $TR_R$.

In the case where the low-level potential $V_{BLL}$ is held in the node ND, Formula 3 is not satisfied but Formula 4 is satisfied, so that the bit line BL is not supplied with $V_{RLL}$ but with a potential set by the precharging, which is $V_{BLH}$ in this case. In the above manner, by detecting the potential of the bit line BL at the time when the potential of the reading signal line RL is set to $V_{RLL}$, data stored in the node ND can be read.

Charge held in the node ND remains held until new charge is supplied in a writing mode, without being affected during and after the operation in the reading mode. Since the off-state current of the transistor $TR_W$ including an oxide semiconductor is extremely low, the charge in the node ND can be held for a long time.

By the way, in the case of a so-called flash memory, it is necessary to keep a proper distance between cells in order to prevent a potential of a control gate from affecting a floating gate of the adjacent cell. This is one of factors inhibiting high integration of the semiconductor device. The factor is attributed to a basic principle of a flash memory, in which a tunneling current flows in applying a high electrical field.

Further, because of the above principle of a flash memory, deterioration of a gate insulating film proceeds and thus another problem of the limit on the number of times of rewriting (approximately 10000 times) occurs.

The semiconductor device which is one embodiment of the disclosed invention is operated by switching of a transistor including an oxide semiconductor and does not use the above-described principle of charge injection by a tunneling current. That is, a high electrical field for charge injection is unnecessary unlike a flash memory. Accordingly, it is unnecessary to consider an influence of a high electrical field from a control gate on an adjacent cell, which facilitates high integration.

Further, charge injection by a tunneling current is not utilized, which means that there are no factors for deterioration of a memory cell. That is, the semiconductor device which is one embodiment of the disclosed invention has higher durability and reliability than a flash memory.

In addition, it is also advantageous that a high electrical field is unnecessary and a large peripheral circuit (such as a booster circuit) is unnecessary as compared to a flash memory.

Note that n-channel transistors in which electrons are majority carriers are used in the above description; it is needless to say that p-channel transistors in which holes are majority carriers can be used instead of the n-channel transistors. In the case of using the p-channel transistors, potentials supplied to respective wirings may be set based on the above-described operation principle.

Figure 1B:
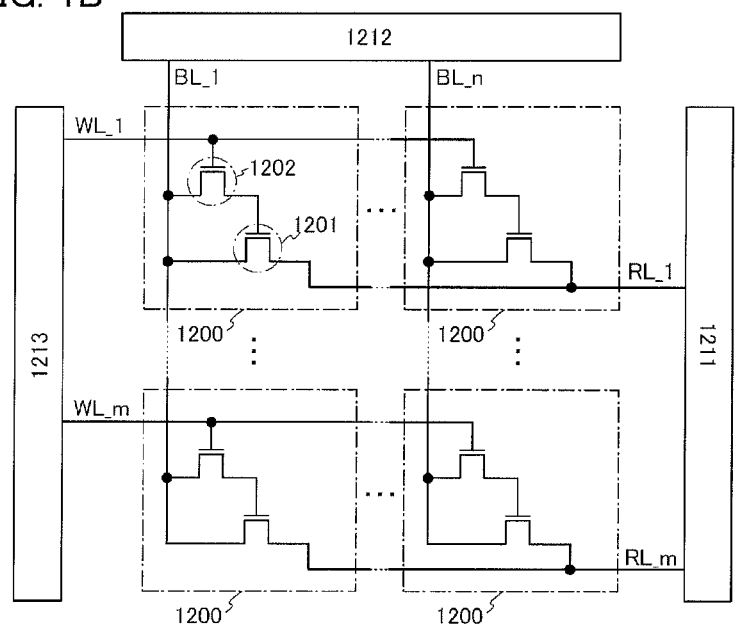

FIG. 1B is an example of a circuit diagram of a semiconductor device having memory capacity of m×n bits in which the semiconductor device illustrated in FIG. 1A is used. FIG. 1B is a circuit diagram of a so-called NOR semiconductor device in which memory cells 1200 are connected in parallel.

The semiconductor device illustrated in FIG. 1B includes a memory cell array and peripheral circuits such as a first driver circuit 1211, a second driver circuit 1212, and a third driver circuit 1213. The memory cell array includes m word lines WL, m reading signal lines RL, n bit lines BL, and a plurality of memory cells 1200 arranged in matrix of m rows (arranged in a vertical direction)×n columns (arranged in a horizontal direction) (m and n are natural numbers). Here, the structure illustrated in FIG. 1A is applied to the memory cell 1200.

That is, each memory cell 1200 includes a first transistor 1201 functioning as a reading transistor and a second transistor 1202 functioning as a writing transistor. A gate electrode of the first transistor 1201 and one of a source electrode and a drain electrode of the second transistor 1202 are electrically connected to each other. The reading signal line RL and one of a source electrode and a drain electrode of the first transistor 1201 are electrically connected to each other. The bit line BL, the other of the source electrode and the drain electrode of the first transistor 1201, and the other of the source electrode and the drain electrode of the second transistor 1202 are electrically connected to one another. The word line WL and a gate electrode of the second transistor 1202 are electrically connected to each other.

In addition, a memory cell 1200 (i,j) of an i-th row and a j-th column (i is an integer which is greater than or equal to 1 and less than or equal to m, and j is an integer which is greater than or equal to 1 and less than or equal to n) is connected to a reading signal line RL(i), a bit line BL(j), and a word line WL(i).

The bit line BL is connected to the second driver circuit 1212. The reading signal line RL is connected to the first driver circuit 1211. The word line WL is connected to the third driver circuit 1213. Note that the second driver circuit 1212, the first driver circuit 1211, and the third driver circuit 1213 are independently provided here; however, a decoder having one or more functions may also be used.

Note that n-channel transistors in which electrons are majority carriers are used in the above description; it is needless to say that p-channel transistors in which holes are majority carriers can be used instead of the n-channel transistors. In the case of using the p-channel transistors, potentials supplied to respective wirings may be set based on the above-described operation principle.

The semiconductor device disclosed in this embodiment does not necessarily include a capacitor that is needed for a DRAM; therefore, the area per unit memory cell can be reduced and integration of the memory cells can be increased. In addition, by sharing the bit line BL by the writing transistor and the reading transistor, the number of wirings per unit memory cell can be reduced. Therefore, the area per unit memory cell can be further reduced and integration of the memory cells can be further increased. For example, given that the minimum processing dimension is F, the area occupied by a memory cell can be 15 $F^2$ to 25 $F^2$.

Note that although the writing transistor having small off-state current is formed using an oxide semiconductor in the above description, the disclosed invention is not limited to this. A material which can realize the off-state current characteristics equivalent to those of the oxide semiconductor, such as a wide gap material (in which Eg>3 eV) like silicon carbide may be used.

Note that the structures, methods, and the like described in this embodiment can be combined as appropriate with any of the structures, methods, and the like described in the other embodiments.

Figure 3:
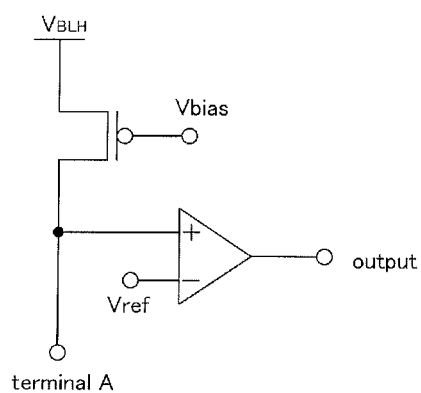
FIG. 3 is a circuit diagram of a semiconductor device.

In FIG. 3, a schematic view of a reading circuit for reading data stored in a memory cell is illustrated. The reading circuit includes a transistor and a sense amplifier circuit.

In reading of the data, a terminal A is connected to a bit line BL connected to a memory cell from which data is to be read. Further, a bias potential Vbias is applied to a gate electrode of the transistor so that a potential of the terminal A is controlled.

The sense amplifier circuit outputs high data when the potential of the terminal A is higher than a reference potential Vref (e.g., 0 V) or low data when the potential of the terminal A is lower than the reference potential Vref. First, the transistor is turned on, and the bit line BL connected to the terminal A is precharged to have the potential $V_{BLH}$. Next, the memory cell from which data is to be read is set to a reading mode, and the potential of the bit line BL connected to the terminal A is compared with the reference potential Vref. Thus, the high data or low data is output in accordance with the data stored in the memory cell.

By using the reading circuit in the above manner, the data stored in the memory cell can be read. Note that the reading circuit of this embodiment is one of examples. Alternatively, another known circuit may be used.

Note that the structures, methods, and the like described in this embodiment can be combined as appropriate with any of the structures, methods, and the like described in the other embodiments.

Embodiment 2

In this embodiment, a structure and a manufacturing method of a semiconductor device according to one embodiment of the disclosed invention will be described with reference to FIGS. 4A and 4B, FIGS. 5A to 5H, and FIGS. 6A to 6E.

<Cross-Sectional Structure and Planar Structure of Semiconductor Device>

Figure 4A:
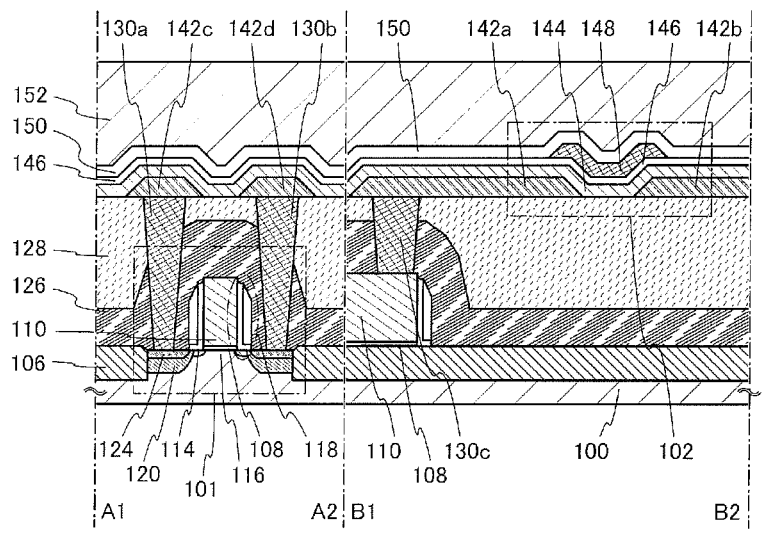
FIGS. 4A and 4B are a cross-sectional view and a plan view of a semiconductor device.
Figure 4B:
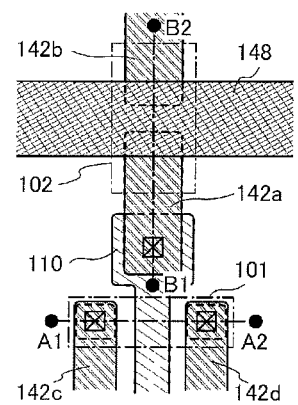

FIGS. 4A and 4B illustrate an example of a structure of the semiconductor device. FIG. 4A is a cross-sectional view of the semiconductor device, and FIG. 4B is a plan view of the semiconductor device. Here, FIG. 4A corresponds to a cross-sectional view taken along lines A1-A2 and B1-B2 of FIG. 4B. The semiconductor device illustrated in FIGS. 4A and 4B is provided with a transistor 101 including a semiconductor material other than an oxide semiconductor, and a transistor 102 including an oxide semiconductor. A transistor including a semiconductor material other than an oxide semiconductor can be operated at high speed easily. On the other hand, a transistor including an oxide semiconductor can hold charge for a long time owing to its characteristics. Note that the transistor 101 serves as a reading transistor $TR_R$, and the transistor 102 serves as a writing transistor $TR_W$.

Although the transistors are n-channel transistors here, it is needless to say that p-channel transistors can be used. Further, it is not necessary to limit a specific structure of a semiconductor device to the structure described here.

The transistor 101 illustrated in FIGS. 4A and 4B includes a channel formation region 116 provided in a substrate 100 including a semiconductor material (such as silicon); impurity regions 114 and high-concentration impurity regions 120 (these regions can be collectively referred to simply as impurity regions) provided so as to interpose the channel formation region 116; a gate insulating layer 108 provided over the channel formation region 116; a gate electrode 110 provided over the gate insulating layer 108; and a source or drain electrode 130a and a source or drain electrode 130b which are electrically connected to the impurity regions. Further, a wiring 142c and a wiring 142d are provided over the source or drain electrode 130a and the source or drain electrode 130b.

Sidewall insulating layers 118 are provided on side surfaces of the gate electrode 110. The high-concentration impurity regions 120 and metal compound regions 124 are provided in regions of the substrate 100 that do not overlap with the sidewall insulating layers 118 when seen from a direction perpendicular to the surface of the substrate 100. The metal compound regions 124 are placed in contact with the high-concentration impurity regions 120. Further, an element isolation insulating layer 106 is formed over the substrate 100 so as to surround the transistor 101, and interlayer insulating layers 126 and 128 are formed to cover the transistor 101. The source or drain electrode 130a and the source or drain electrode 130b are electrically connected to the metal compound regions 124 through openings formed in the interlayer insulating layers 126 and 128. That is, the source or drain electrode 130a and the source or drain electrode 130b are electrically connected to the high-concentration impurity regions 120 and the impurity regions 114 through the metal compound regions 124. Further, an electrode 130c is electrically connected to the gate electrode 110 through an opening formed in the interlayer insulating layers 126 and 128. Note that the sidewall insulating layers 118 are not formed in some cases, for integration of the transistor 101 and the like.

The transistor 102 illustrated in FIGS. 4A and 4B includes a source or drain electrode 142a and a source or drain electrode 142b which are provided over the interlayer insulating layer 128; an oxide semiconductor layer 144 electrically connected to the source or drain electrode 142a and the source or drain electrode 142b; a gate insulating layer 146 covering the source or drain electrode 142a, the source or drain electrode 142b, and the oxide semiconductor layer 144; and a gate electrode 148 overlapping with the oxide semiconductor layer 144, over the gate insulating layer 146.

Here, the oxide semiconductor layer 144 is preferably an oxide semiconductor layer which is highly purified by sufficiently removing an impurity such as hydrogen therefrom or by supplying a sufficient amount of oxygen thereto. Specifically, the hydrogen concentration of the oxide semiconductor layer 144 is $5\times10^{19}$ atoms/cm$^3$ or less, preferably $5\times10^{18}$ atoms/cm$^3$ or less, more preferably $5\times10^{17}$ atoms/cm$^3$ or less.

Note that the hydrogen concentration of the oxide semiconductor layer 144 is measured by secondary ion mass spectroscopy (SIMS).

In the oxide semiconductor layer 144 which is highly purified by sufficiently reducing the concentration of hydrogen therein and in which a defect level in an energy gap due to oxygen deficiency is reduced by supplying a sufficient amount of oxygen, the carrier density is lower than $1 \times 10^{12}/\text{cm}^3$, preferably lower than $1 \times 10^{11}/\text{cm}^3$, more preferably lower than $1.45 \times 10^{10}/\text{cm}^3$. For example, the off-state current (here, per unit channel width (1 μm)) of the transistor 102 at room temperature (25° C.) is 100 zA/μm (1 zA (zeptoampere) is $1 \times 10^{-21}$ A) or less, preferably 10 zA/μm or less. The off-state current of the transistor 102 at 85° C. is 100 zA/μm ($1 \times 10^{-19}$ A/μm) or less, preferably 10 zA/μm ($1 \times 10^{-20}$ A/μm) or less. With the use of such an i-type (intrinsic) or substantially i-type oxide semiconductor, the transistor 102 which has extremely excellent off-state current characteristics can be obtained.

Note that since the oxide semiconductor layer 144 is not patterned to have an island shape in the transistor 102 in FIGS. 4A and 4B, the oxide semiconductor layer 144 can be prevented from being contaminated by etching for patterning.

Note that in the transistor 102, edge portions of the source or drain electrode 142a and the source or drain electrode 142b are preferably tapered. Here, the taper angle is, for example, greater than or equal to 30° and less than or equal to 60°. Note that the taper angle means an inclination angle formed with a side surface and a bottom surface of a layer having a tapered shape (for example, the source or drain electrode 142a) when seen from a direction perpendicular to a cross section (a plane perpendicular to a surface of a substrate) of the layer. When the edge portions of the source or drain electrode 142a and the source or drain electrode 142b are tapered, the coverage of the edge portions of the source or drain electrode 142a and the source or drain electrode 142b with the oxide semiconductor layer 144 can be improved and disconnection can be prevented.

Further, an interlayer insulating layer 150 is provided over the transistor 102 and an interlayer insulating layer 152 is provided over the interlayer insulating layer 150.

<Manufacturing Method of Semiconductor Device>

Next, an example of a manufacturing method of the semiconductor device will be described. First, a manufacturing method of the transistor 101 will be described below with reference to FIGS. 5A to 5H, and then a manufacturing method of the transistor 102 will be described below with reference to FIGS. 6A to 6E.

<Manufacturing Method of Transistor 101>

Figure 5A:
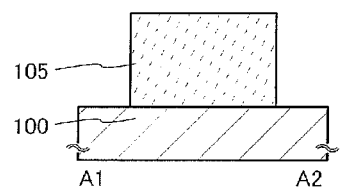
FIGS. 5A to 5H are cross-sectional views relating to a manufacturing process of a semiconductor device.

First, the substrate 100 including a semiconductor material is prepared (see FIG. 5A). As the substrate 100 including a semiconductor material, a single crystal semiconductor substrate or a polycrystalline semiconductor substrate formed using silicon, silicon carbide, or the like; a compound semiconductor substrate formed using silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Examples of the SOI substrate include a substrate which has a semiconductor layer over its insulating substrate such as a glass substrate, with an insulating layer between the semiconductor layer and the insulating substrate.

A protective layer 105 serving as a mask for forming an element isolation insulating layer is formed over the substrate 100 (see FIG. 5A). As the protective layer 105, an insulating layer formed using silicon oxide, silicon nitride, silicon oxynitride, or the like can be used, for example. Note that before or after this step, an impurity element imparting n-type conductivity or an impurity element imparting p-type conductivity may be added to the substrate 100 in order to control the threshold voltage of the transistor. When the semiconductor material included in the substrate 100 is silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 105 (i.e., an exposed region) is removed by etching with the use of the protective layer 105 as a mask. Thus, a semiconductor region 104 which is separated from another semiconductor region is formed (see FIG. 5B). As the etching, dry etching is preferably employed, but wet etching may be performed. An etching gas and an etchant can be selected as appropriate depending on a material of a layer to be etched.

Figure 5B:
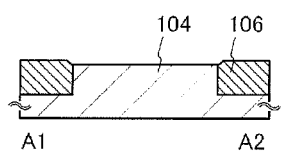

Then, an insulating layer is formed so as to cover the semiconductor region 104, and the insulating layer in a region overlapping with the semiconductor region 104 is selectively removed, so that the element isolation insulating layer 106 is formed (see FIG. 5B). The insulating layer is formed using silicon oxide, silicon nitride, silicon oxynitride, or the like. As a method for removing the insulating layer, any of etching treatment and polishing treatment such as CMP can be employed. Note that the protective layer 105 is removed after the formation of the semiconductor region 104 or after the formation of the element isolation insulating layer 106.

Next, an insulating layer is formed over the semiconductor region 104, and a layer including a conductive material is formed over the insulating layer.

The insulating layer is to be a gate insulating layer later and preferably has a single-layer structure or a layered structure using a film including silicon oxide, silicon oxynitride, silicon nitride, hafnium oxide, aluminum oxide, tantalum oxide, yttrium oxide, hafnium silicate ($\text{HfSi}_x\text{O}_y$ (x>0, y>0)), hafnium silicate ($\text{HfSi}_x\text{O}_y$ (x>0, y>0)) to which nitrogen is added, hafnium aluminate ($\text{HfAl}_x\text{O}_y$ (x>0, y>0)) to which nitrogen is added, or the like which is obtained by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe, and a gas such as oxygen, nitrogen oxide, ammonia, nitrogen, or hydrogen. The thickness of the insulating layer can be, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, and a spin coating method can be employed. Note that this embodiment describes an example of the case where the layer including a conductive material is formed using a metal material.

Figure 5C:
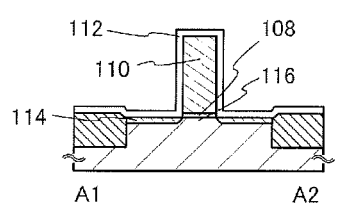

After that, the insulating layer and the layer including a conductive material are selectively etched, so that the gate insulating layer 108 and the gate electrode 110 are formed (see FIG. 5C).

Next, an insulating layer 112 that covers the gate electrode 110 is formed (see FIG. 5C). Then, the impurity regions 114 with a shallow junction depth are formed by adding phosphorus (P), arsenic (As), or the like to the semiconductor region 104 (see FIG. 5C). Note that phosphorus or arsenic is added here in order to form an n-channel transistor; an impurity element such as boron (B) or aluminum (Al) may be added in the case of forming a p-channel transistor. With the formation of the impurity regions 114, the channel formation region 116 is formed in the semiconductor region 104 below the gate insulating layer 108 (see FIG. 5C). Here, the concentration of the impurity added can be set as appropriate; the concentration is preferably increased when a semiconductor element is highly miniaturized. The step in which the impurity regions 114 are formed after the formation of the insulating layer 112 is employed here; alternatively, the insulating layer 112 may be formed after the formation of the impurity regions 114.

Figure 5D:
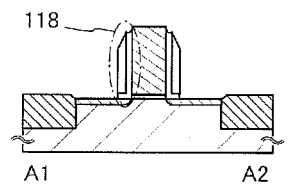
Figure 5E:
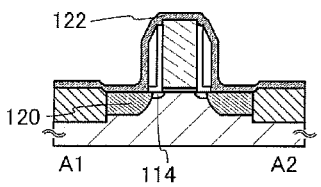
Figure 5F:
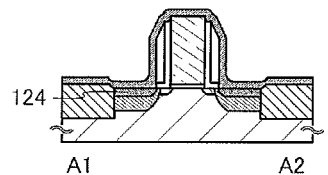

Next, the sidewall insulating layers 118 are formed (see FIG. 5D). An insulating layer is formed so as to cover the insulating layer 112 and then subjected to highly anisotropic etching, whereby the sidewall insulating layers 118 can be formed in a self-aligned manner. At this time, it is preferable to partly etch the insulating layer 112 so that a top surface of the gate electrode 110 and top surfaces of the impurity regions 114 are exposed. Note that the sidewall insulating layers 118 are not provided in some cases so that high integration or the like are realized.

Then, an insulating layer is formed so as to cover the gate electrode 110, the impurity regions 114, the sidewall insulating layers 118, and the like. Next, phosphorus (P), arsenic (As), or the like is added to part of the impurity regions 114, so that the high-concentration impurity regions 120 in contact with the impurity regions 114 are formed (see FIG. 5E). After that, the insulating layer is removed, and a metal layer 122 is formed so as to cover the gate electrode 110, the sidewall insulating layers 118, the high-concentration impurity regions 120, and the like (see FIG. 5E). Any film formation method such as a vacuum evaporation method, a sputtering method, or a spin coating method can be employed for forming the metal layer 122. The metal layer 122 is preferably formed using a metal material that reacts with a semiconductor material included in the semiconductor region 104 to be a low-resistance metal compound. Examples of such a metal material are titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 5F). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the metal compound regions 124 are formed.

Figure 5G:
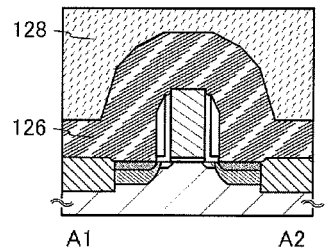

Then, the interlayer insulating layers 126 and 128 are formed so as to cover the components formed in the above steps (see FIG. 5G). The interlayer insulating layers 126 and 128 can be formed using a material including an inorganic insulating material such as silicon oxide, silicon oxynitride, silicon nitride, hafnium oxide, aluminum oxide, or tantalum oxide. Moreover, the interlayer insulating layers 126 and 128 can be formed using an organic insulating material such as polyimide or an acrylic resin. Note that although a layered structure of the interlayer insulating layers 126 and 128 is employed here, one embodiment of the disclosed invention is not limited thereto. A single-layer structure or a layered structure including three or more layers can also be used. After the formation of the interlayer insulating layer 128, a surface of the interlayer insulating layer 128 is preferably planarized by CMP, etching, or the like.

Figure 5H:
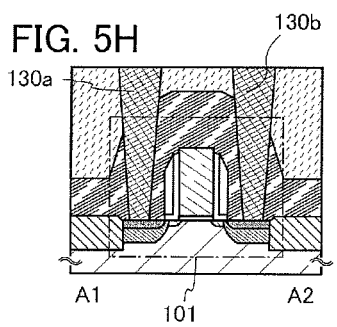

Then, openings that reach the metal compound regions 124 are formed in the interlayer insulating layers, and the source or drain electrode 130a and the source or drain electrode 130b are formed in the openings (see FIG. 5H). The source or drain electrode 130a and the source or drain electrode 130b can be formed in such a manner, for example, that a conductive layer is formed in a region including the openings by a PVD method, a CVD method, or the like and then part of the conductive layer is removed by etching, CMP, or the like.

Specifically, it is possible to employ a method, for example, in which a thin titanium film is formed in a region including the openings by a PVD method and a thin titanium nitride film is formed by a CVD method, and then, a tungsten film is formed so as to fill the openings. Here, the titanium film formed by a PVD method has a function of deoxidizing an oxide film (e.g., a native oxide film) formed on a surface over which the titanium film is formed, to lower the contact resistance with the lower electrode or the like (the metal compound region 124, here). The titanium nitride film formed after the formation of the titanium film has a barrier function of preventing diffusion of the conductive material. A copper film may be formed by a plating method after the formation of the barrier film of titanium, titanium nitride or the like.

Note that in the case where the source or drain electrode 130a and the source or drain electrode 130b are formed by removing part of the conductive layer, the step is preferably performed so that the surface is planarized. For example, when a thin titanium film and a thin titanium nitride film are formed in a region including the openings and then a tungsten film is formed so as to fill the openings, excess tungsten, excess titanium, excess titanium nitride, or the like is removed and the planarity of the surface can be improved by subsequent CMP. The unevenness of the surface including surfaces of the source or drain electrode 130a and the source or drain electrode 130b is reduced to improve the planarity, whereby an electrode, a wiring, an insulating layer, a semiconductor layer, and the like formed in later steps can cover the surface favorably.

Note that only the source or drain electrode 130a and the source or drain electrode 130b which are in contact with the metal compound regions 124 are shown here; however, an electrode that is in contact with the gate electrode 110, and the like can also be formed in this step. There is no particular limitation on a material used for the source or drain electrode 130a and the source or drain electrode 130b, and a variety of conductive materials can be used. For example, a conductive material such as molybdenum, titanium, chromium, tantalum, tungsten, aluminum, copper, neodymium, or scandium can be used. In view of heat treatment performed later, it is preferable that the source or drain electrode 130a and the source or drain electrode 130b be formed using a material having heat resistance high enough to withstand the heat treatment.

Through the above steps, the transistor 101 using the substrate 100 including a semiconductor material is formed (see FIG. 5H). The transistor 101 using a semiconductor material other than an oxide semiconductor can be operated at high speed.

Note that an electrode, a wiring, an insulating layer, or the like may be further formed after the above steps. When a wiring has a multi-layer structure including a layered structure of an interlayer insulating layer and a conductive layer, a highly integrated semiconductor device can be provided.

<Manufacturing Method of Transistor 102>

Next, a manufacturing process of the transistor 102 over the interlayer insulating layer 128 will be described with reference to FIGS. 6A to 6E. Note that FIGS. 6A to 6E illustrate a manufacturing process of electrodes, the transistor 102, and the like over the interlayer insulating layer 128; therefore, the transistor 101 and the like are omitted.

Figure 6A:
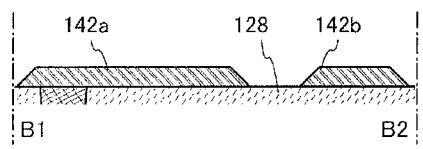
FIGS. 6A to 6E are cross-sectional views relating to a manufacturing process of a semiconductor device.

First, a conductive layer is formed over the interlayer insulating layer 128 and is selectively etched, so that the source or drain electrode 142a and the source or drain electrode 142b are formed (see FIG. 6A).

The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy including any of these elements as a component; or the like can be used. Moreover, one or more materials selected from manganese, magnesium, zirconium, and beryllium may be used. Alternatively, aluminum combined with one or more of elements selected from titanium, tantalum, tungsten, molybdenum, chromium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source or drain electrode 142a and the source or drain electrode 142b having tapered shapes.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer is preferably etched so that edge portions of the source or drain electrode 142a and the source or drain electrode 142b are tapered. Here, a taper angle is preferably greater than or equal to 30° and less than or equal to 60°, for example. The edge portions of the source or drain electrode 142a and the source or drain electrode 142b are etched so as to be tapered, whereby the coverage of the edge portions of the source or drain electrode 142a and the source or drain electrode 142b with the gate insulating layer 146 to be formed later can be improved and disconnection can be prevented.

The channel length (L) of the transistor is determined by a distance between a lower edge portion of the source or drain electrode 142a and a lower edge portion of the source or drain electrode 142b. Note that in the case where the transistor having a channel length (L) of less than 25 nm is formed, light exposure for forming a mask is preferably performed with extreme ultraviolet rays whose wavelength is as short as several nanometers to several tens of nanometers. The resolution of light exposure with extreme ultraviolet rays is high and the depth of focus is large. For these reasons, the channel length (L) of the transistor to be formed later can be in the range of greater than or equal to 10 nm and less than or equal to 1000 nm (1 μm), and thus, the circuit can be operated at higher speed. Moreover, miniaturization can lead to low power consumption of a semiconductor device.

Note that an insulating layer functioning as a base may be provided over the interlayer insulating layer 128. The insulating layer can be formed by a PVD method, a CVD method, or the like.

Note that an insulating layer may be formed over the source or drain electrode 142a and the source or drain electrode 142b. With the insulating layer, parasitic capacitance between a gate electrode to be formed later and the source or drain electrode 142a and between the gate electrode and the source or drain electrode 142b can be reduced.

Figure 6B:
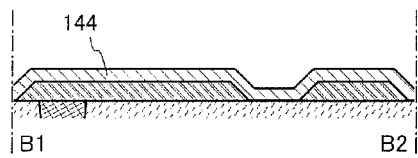

Next, the oxide semiconductor layer 144 is formed so as to cover the source or drain electrode 142a and the source or drain electrode 142b (see FIG. 6B).

The oxide semiconductor layer 144 can be formed using any of the following oxide semiconductors: a four-component metal oxide such as an In—Sn—Ga—Zn—O-based oxide semiconductor; three-component metal oxides such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; two-component metal oxides such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; and single-component metal oxides such as an In—O-based oxide semiconductor, a Sn—O-based oxide semiconductor, and a Zn—O-based oxide semiconductor.

The oxide semiconductor layer 144 preferably includes In, more preferably In and Ga. Dehydration or dehydrogenation treatment to be performed later is effective in making the oxide semiconductor layer 144 i-type (intrinsic).

In particular, an In—Ga—Zn—O-based oxide semiconductor material has sufficiently high resistance when there is no electric field and thus off-state current can be sufficiently reduced. In addition, with high field-effect mobility, the In—Ga—Zn—O-based oxide semiconductor material is suitable for a semiconductor material used in a semiconductor device.

As a typical example of the In—Ga—Zn—O-based oxide semiconductor material, one represented by $InGaO_3(ZnO)_m$ (m>0) is given. Another example of the oxide semiconductor material is represented by $InMO_3(ZnO)_m$ (m>0) where M is used instead of Ga. Here, M denotes one or more of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are only examples.

As a target for forming the oxide semiconductor layer 144 by a sputtering method, a target having a composition ratio of In:Ga:Zn=1:x:y (x is 0 or more and y is more than or equal to 0.5 and less than or equal to 5) is preferably used. For example, a target having a composition ratio of $In_2O_3:Ga_2O_3:ZnO=1:1:1$ [molar ratio], a target having a composition ratio of $In_2O_3:Ga_2O_3:ZnO=1:1:2$ [molar ratio], a target having a composition ratio of $In_2O_3:Ga_2O_3:ZnO=2:2:1$ [molar ratio], a target having a composition ratio of $In_2O_3:Ga_2O_3:ZnO=1:1:4$ [molar ratio], or the like can be used. Alternatively, a target having a composition ratio of $In_2O_3:Ga_2O_3:ZnO=2:0:1$ [molar ratio] can be used.

In this embodiment, the oxide semiconductor layer 144 having an amorphous structure can be formed by a sputtering method with the use of an In—Ga—Zn—O-based metal oxide target.

It is preferable that a metal oxide contained in the metal oxide target have a relative density of 80% or higher, preferably 95% or higher, more preferably 99.9% or higher. With the use of the metal oxide target with high relative density, the oxide semiconductor layer 144 having a dense structure can be formed.

A sputtering gas for the formation of the oxide semiconductor layer 144 is preferably a rare gas (typically argon), oxygen, or a mixed gas of a rare gas (typically argon) and oxygen. Further, it is preferable to use a high-purity gas in which impurities such as hydrogen, water, a hydroxyl group, or hydride are removed so that the concentration is decreased to 1 ppm or less (preferably 10 ppb or less).

In forming the oxide semiconductor layer 144, the object is held in a treatment chamber that is maintained at reduced pressure and is heated so that the temperature of the object is higher than or equal to 100° C. and lower than 550° C., preferably higher than or equal to 200° C. and lower than or equal to 400° C. Alternatively, the temperature of the object in forming the oxide semiconductor layer 144 may be room temperature. Then, a sputtering gas from which hydrogen, water, and the like are removed is introduced while moisture in the treatment chamber is removed, whereby the oxide semiconductor layer 144 is formed using the above-described target. The oxide semiconductor layer 144 is formed while the object is heated, so that an impurity included in the oxide semiconductor layer 144 can be reduced. Moreover, damage due to sputtering can be reduced. An entrapment vacuum pump is preferably used in order to remove moisture in the treatment chamber. For example, a cryopump, an ion pump, or a titanium sublimation pump can be used. A turbo pump provided with a cold trap may be used. By evacuation with the cryopump or the like, hydrogen, water, and the like can be removed from the treatment chamber, whereby the concentration of impurity included in the oxide semiconductor layer 144 can be reduced.

The oxide semiconductor layer 144 can be formed under the following conditions, for example: the distance between the object and the target is 170 mm; the pressure is 0.4 Pa; the direct-current (DC) power is 0.5 kW; and the atmosphere is an oxygen (oxygen: 100%) atmosphere, an argon (argon: 100%) atmosphere, or a mixed atmosphere of oxygen and argon. Note that it is preferable to use a pulse direct current (DC) power supply because powder substances (also referred to as particles or dust) generated in film deposition can be reduced and the thickness distribution can be uniform. The thickness of the oxide semiconductor layer 144 is greater than or equal to 1 nm and less than or equal to 50 nm, preferably greater than or equal to 1 nm and less than or equal to 30 nm, more preferably greater than or equal to 1 nm and less than or equal to 10 nm. Using the oxide semiconductor layer 144 with such a thickness can suppress a short-channel effect due to miniaturization. Note that an appropriate thickness differs depending on an oxide semiconductor material used, the usage of a semiconductor device, or the like; therefore, it is also possible to set the thickness as appropriate depending on the material to be used, the usage, or the like.

Note that before the oxide semiconductor layer 144 is formed by a sputtering method, a material attached to a surface over which the oxide semiconductor layer 144 is to be formed (e.g., a surface of the interlayer insulating layer 128) is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near an object. Note that a nitrogen atmosphere, a helium atmosphere, an oxygen atmosphere, or the like may be used instead of an argon atmosphere.

After that, heat treatment (first heat treatment) is preferably performed on the oxide semiconductor layer 144. Excess hydrogen (including water and a hydroxyl group) included in the oxide semiconductor layer 144 can be removed by the first heat treatment; thus, the structure of the oxide semiconductor layer can be improved and a defect level in an energy gap can be reduced. The temperature of the first heat treatment is, for example, higher than or equal to 300° C. and lower than 550° C., or higher than or equal to 400° C. and lower than or equal to 500° C.

The heat treatment can be performed in such a way that, for example, an object is introduced into an electric furnace in which a resistance heating element or the like is used, and heated in a nitrogen atmosphere at 450° C. for one hour. The oxide semiconductor layer 144 is not exposed to the air during the heat treatment so that entry of water and hydrogen can be prevented.

The heat treatment apparatus is not limited to the electric furnace and may be an apparatus for heating an object by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows. An object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be changed to a gas containing oxygen during the process. This is because a defect level in an energy gap caused by oxygen deficiency can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6N (99.9999%) or higher, preferably 7N (99.99999%) or higher (i.e., the impurity concentration is 1 ppm or less, preferably 0.1 ppm or less).

In any case, the i-type (intrinsic) or substantially i-type oxide semiconductor layer 144 in which impurities are reduced by the first heat treatment is formed, which enables a transistor having extremely excellent characteristics to be realized.

The above heat treatment (first heat treatment) can be referred to as dehydration treatment, dehydrogenation treatment, or the like because it has an effect of removing hydrogen, water, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be performed once or plural times.

Figure 6C:
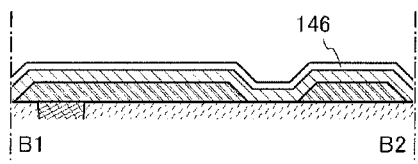

Next, the gate insulating layer 146 which is in contact with the oxide semiconductor layer 144 is formed (see FIG. 6C). The gate insulating layer 146 can be formed by a CVD method, a sputtering method, or the like. The gate insulating layer 146 is preferably formed so as to include silicon oxide, silicon nitride, silicon oxynitride, aluminum oxide, tantalum oxide, hafnium oxide, yttrium oxide, hafnium silicate (Hf-$Si_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a layered structure. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

As described above, when the gate insulating layer is thin, there is a problem of gate leakage due to a tunneling effect or the like. In order to solve the problem of gate leakage, a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added is preferably used for the gate insulating layer 146. By using a high-k material for the gate insulating layer 146, electrical characteristics can be ensured and the thickness can be large to prevent gate leakage. Note that a layered structure of a film including a high-k material and a film including any one of silicon oxide, silicon nitride, silicon oxynitride, silicon nitride oxide, aluminum oxide, and the like may be employed.

After the gate insulating layer 146 is formed, second heat treatment is desirably performed in an inert gas atmosphere or an oxygen atmosphere. The temperature of the heat treatment is set to higher than or equal to 200° C. and lower than or equal to 450° C., preferably higher than or equal to 250° C. and lower than or equal to 350° C. For example, the heat treatment may be performed at 250° C. for one hour in a nitrogen atmosphere. The second heat treatment can reduce variation in electrical characteristics of the transistor. Further, in the case where the gate insulating layer 146 includes oxygen, oxygen can be supplied to the oxide semiconductor layer 144 to cover oxygen deficiency in the oxide semiconductor layer 144, so that an i-type (intrinsic semiconductor) or substantially i-type oxide semiconductor layer can be formed.

Note that the second heat treatment is performed after the gate insulating layer 146 is formed in this embodiment; the timing of the second heat treatment is not particularly limited thereto. For example, the second heat treatment may be performed after the gate electrode is formed. Furthermore, the first heat treatment and the second heat treatment may be successively performed, the first heat treatment may also serve as the second heat treatment, or the second heat treatment may also serve as the first heat treatment.

Figure 6D:
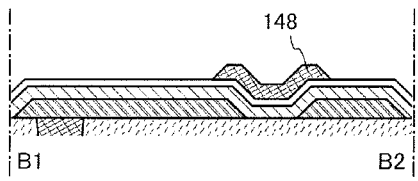

Next, over the gate insulating layer 146, the gate electrode 148 is formed in a region overlapping with the oxide semiconductor layer 144 (see FIG. 6D). The gate electrode 148 can be formed in such a manner that a conductive layer is formed over the gate insulating layer 146 and then selectively etched. The conductive layer to be the gate electrode 148 can be formed by a PVD method such as a sputtering method or a CVD method such as a plasma CVD method. The details are the same or substantially the same as those of the source or drain electrode 142a or the like; thus, the description thereof can be referred to.

Figure 6E:
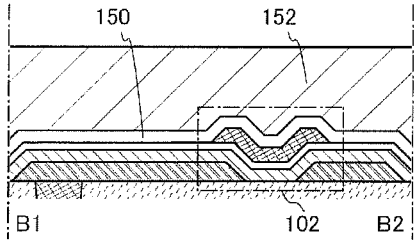

Next, the interlayer insulating layers 150 and 152 are formed over the gate insulating layer 146 and the gate electrode 148 (see FIG. 6E). The interlayer insulating layers 150 and 152 can be formed by a PVD method, a CVD method, or the like. The interlayer insulating layers 150 and 152 can be formed using a material including an inorganic insulating material such as silicon oxide, silicon oxynitride, silicon nitride, hafnium oxide, aluminum oxide, or tantalum oxide. Note that a layered structure of the interlayer insulating layers 150 and 152 is used in this embodiment, but one embodiment of the disclosed invention is not limited to this example. A single-layer structure or a layered structure including three or more layers can also be used. Alternatively, a structure in which an interlayer insulating layer is not provided can be employed.

Note that the interlayer insulating layer 152 is desirably formed so as to have a planarized surface. This is because an electrode, a wiring, or the like can be favorably formed over the interlayer insulating layer 152 even in the case where the semiconductor device is miniaturized, for example. The interlayer insulating layer 152 can be planarized using a method such as CMP (chemical mechanical polishing).

Through the above steps, the transistor 102 using the highly purified oxide semiconductor layer 144 is completed (see FIG. 6E).

The transistor 102 illustrated in FIG. 6E includes the oxide semiconductor layer 144; the source or drain electrode 142a and the source or drain electrode 142b which are electrically connected to the oxide semiconductor layer 144; the gate insulating layer 146 covering the oxide semiconductor layer 144, the source or drain electrode 142a, and the source or drain electrode 142b; and the gate electrode 148 over the gate insulating layer 146.

Since the oxide semiconductor layer 144 is highly purified in the transistor 102 illustrated in this embodiment, the hydrogen concentration is $5 \times 10^{19}$ atoms/cm$^3$ or less, preferably $5 \times 10^{18}$ atoms/cm$^3$ or less, more preferably $5 \times 10^{17}$ atoms/cm$^3$ or less. In addition, the value of the carrier density of the oxide semiconductor layer 144 is sufficiently low (e.g., lower than $1 \times 10^{12}$/cm$^3$, preferably lower than $1.45 \times 10^{10}$/cm$^3$) in comparison with that of a general silicon wafer (approximately $1\times10^{14}/cm^3$). Thus, the off-state current is sufficiently low. For example, the off-state current (here, per unit channel width (1 μm)) of the transistor 102 at room temperature (25° C.) is 100 zA/μm (1 zA (zeptoampere) is $1\times10^{-21}$ A) or less, preferably 10 zA/μm or less.

With the use of the oxide semiconductor layer 144 which is highly purified and becomes intrinsic, the off-state current of the transistor can be sufficiently reduced. By using such a transistor, a semiconductor device in which memory data can be stored for an extremely long time can be obtained.

The structures, methods, and the like described in this embodiment can be combined as appropriate with any of the structures, methods, and the like described in the other embodiments.

Embodiment 3

In this embodiment, a structure and a manufacturing method of a semiconductor device according to another embodiment of the disclosed invention, which are different from those of Embodiment 2, will be described with reference to FIGS. 7A and 7B and FIGS. 8A to 8D.

<Cross-Sectional Structure and Planar Structure of Semiconductor Device>

Figure 7A:
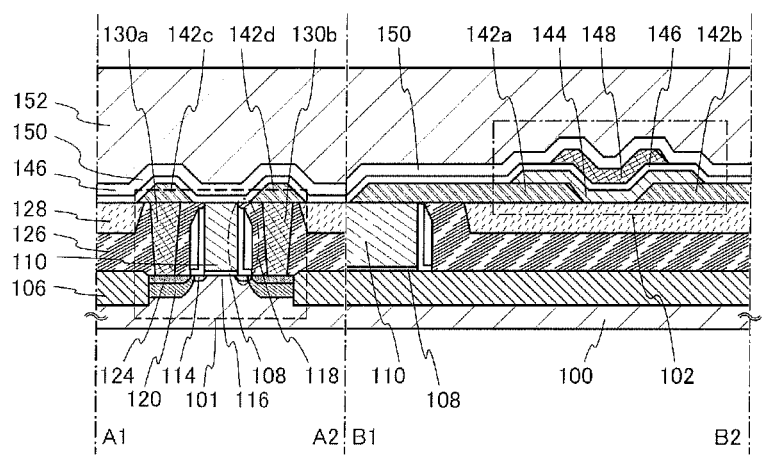
FIGS. 7A and 7B are a cross-sectional view and a plan view of a semiconductor device.
Figure 7B:
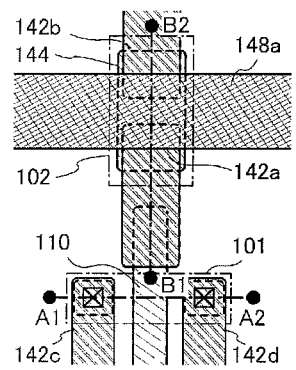

FIGS. 7A and 7B illustrate an example of a structure of the semiconductor device. FIG. 7A is a cross-sectional view of the semiconductor device, and FIG. 7B is a plan view of the semiconductor device. Here, FIG. 7A corresponds to a cross-sectional view taken along lines A1-A2 and B1-B2 of FIG. 7B. The semiconductor device illustrated in FIGS. 7A and 7B is provided with a transistor 101 including a semiconductor material other than an oxide semiconductor, and a transistor 102 including an oxide semiconductor. A transistor including a semiconductor material other than an oxide semiconductor can be operated at high speed easily. On the other hand, a transistor including an oxide semiconductor can hold charge for a long time owing to its characteristics. The transistor 101 serves as a reading transistor, and the transistor 102 serves as a writing transistor.

Although the transistors are n-channel transistors here, it is needless to say that p-channel transistors can be used. Since the technical nature of the disclosed invention is to use an oxide semiconductor in the transistor 102 so that data can be stored, it is not necessary to limit a specific structure of a semiconductor device to the structure described here.

The transistor 101 illustrated in FIGS. 7A and 7B includes a channel formation region 116 provided in a substrate 100 including a semiconductor material (such as silicon); impurity regions 114 and high-concentration impurity regions 120 (these regions can be collectively referred to simply as impurity regions) provided so as to interpose the channel formation region 116; a gate insulating layer 108 provided over the channel formation region 116; a gate electrode 110 provided over the gate insulating layer 108; and a source or drain electrode 130a and a source or drain electrode 130b which are electrically connected to the impurity regions. Further, a wiring 142c and a wiring 142d are provided over the source or drain electrode 130a and the source or drain electrode 130b.

Sidewall insulating layers 118 are provided on side surfaces of the gate electrode 110. The high-concentration impurity regions 120 are provided in regions of the substrate 100 that do not overlap with the sidewall insulating layers 118 when seen from a direction perpendicular to the surface of the substrate 100. Metal compound regions 124 are placed in contact with the high-concentration impurity regions 120. Further, an element isolation insulating layer 106 is formed over the substrate 100 so as to surround the transistor 101. The interlayer insulating layers 126 and 128 are provided so as to have opening provided over the gate electrode 110, and to cover the transistor 101. The source or drain electrode 130a and the source or drain electrode 130b are electrically connected to the metal compound regions 124 through openings formed in the interlayer insulating layer 126. That is to say, the source or drain electrode 130a and the source or drain electrode 130b are electrically connected to the high-concentration impurity regions 120 and the impurity regions 114 through the metal compound regions 124. Note that the sidewall insulating layers 118 are not formed in some cases, for integration or the like of the transistor 101.

The transistor 102 illustrated in FIGS. 7A and 7B includes a source or drain electrode 142a and a source or drain electrode 142b which are provided over the interlayer insulating layer 128; an island-like oxide semiconductor layer 144 electrically connected to the source or drain electrode 142a and the source or drain electrode 142b; a gate insulating layer 146 covering the source or drain electrode 142a, the source or drain electrode 142b, and the island-like oxide semiconductor layer 144; and a gate electrode 148 overlapping with the island-like oxide semiconductor layer 144, over the gate insulating layer 146.

Here, the source or drain electrode 142a is formed directly on the gate electrode 110, whereby the transistor 101 and the transistor 102 are electrically connected to each other. That is, the semiconductor device described in this embodiment has a structure in which the transistor 102 is formed above the transistor 110, from which a portion over the top surface of the gate electrode 110 is removed, in the semiconductor device described in Embodiment 2.

Here, the oxide semiconductor layer 144 is preferably an oxide semiconductor layer which is highly purified by sufficiently removing an impurity such as hydrogen therefrom or by supplying a sufficient amount of oxygen thereto. Specifically, the hydrogen concentration of the oxide semiconductor layer 144 is $5\times10^{19}$ atoms/cm$^3$ or less, preferably $5\times10^{18}$ atoms/cm$^3$ or less, more preferably $5\times10^{17}$ atoms/cm$^3$ or less. Note that the hydrogen concentration of the oxide semiconductor layer 144 is measured by secondary ion mass spectroscopy (SIMS). In the oxide semiconductor layer 144 which is highly purified by sufficiently reducing the concentration of hydrogen therein and in which a defect level in an energy gap due to oxygen deficiency is reduced by supplying a sufficient amount of oxygen, the carrier density is lower than $1\times10^{12}/cm^3$, preferably lower than $1\times10^{11}/cm^3$, more preferably lower than $1.45\times10^{10}/cm^3$. For example, the off-state current (here, per unit channel width (1 μm)) of the transistor 102 at room temperature (25° C.) is 100 zA/μm (1 zA (zeptoampere) is $1\times10^{-21}$ A) or less, preferably 10 zA/μm or less. With the use of such an i-type (intrinsic) or substantially i-type oxide semiconductor, the transistor 102 which has extremely excellent off-state current characteristics can be obtained.

Note that in the transistor 102, edge portions of the source or drain electrode 142a and the source or drain electrode 142b are preferably tapered. Here, the taper angle is, for example, greater than or equal to 30° and less than or equal to 60°. Note that the taper angle means an inclination angle formed with a side surface and a bottom surface of a layer having a tapered shape (for example, the source or drain electrode 142a) when seen from a direction perpendicular to a cross section (a plane perpendicular to a surface of a substrate) of the layer. When the edge portions of the source or drain electrode 142a and the source or drain electrode 142b are tapered, the coverage of the edge portions of the source or drain electrode 142a and the source or drain electrode 142b with the oxide semiconductor layer 144 can be improved and disconnection can be prevented.

Further, an interlayer insulating layer 150 is provided over the transistor 102, and an interlayer insulating layer 152 is provided over the interlayer insulating layer 150.

<Manufacturing Method of Semiconductor Device>

Next, an example of a manufacturing method of the semiconductor device will be described. Steps performed after formation of the transistor 101, i.e., a manufacturing method of the transistor 102, will be described below with reference to FIGS. 8A to 8D. The transistor 101 can be manufactured by a method which is the same or substantially the same as that described in Embodiment 2, and description in Embodiment 2 can be referred to.

Figure 8A:
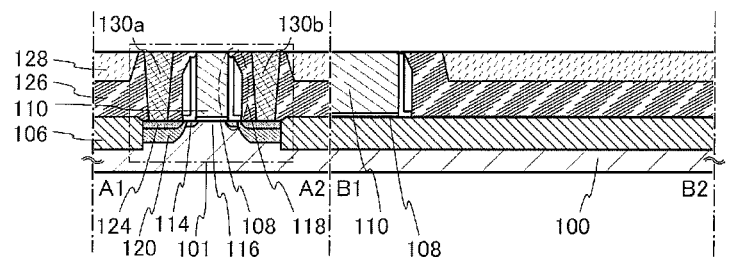
FIGS. 8A to 8D are cross-sectional views relating to a manufacturing process of a semiconductor device.

The transistor 101 is formed by the method described in Embodiment 2 first, and then, a portion of the transistor 101 over a top surface of the gate electrode 110 is removed (see FIG. 8A). The portion of the transistor 101 over the top surface of the gate electrode 110 is removed by performing polishing treatment (CMP treatment) on the transistor 101 until the top surface of the gate electrode 110 is exposed. Thus, portions of the interlayer insulating layers 126 and 128 and the source and drain electrodes 130a and 130b over the gate electrode 110 are removed. At this time, the surface including the interlayer insulating layers 126 and 128 and the source and drain electrodes 130a and 130b is planarized, so that an electrode, a wiring, an insulating layer, a semiconductor layer, and the like can be favorably formed in later steps. The electrode 130c described in Embodiment 2 would be completely removed by the CMP treatment and thus does not need to be formed.

The top surface of the gate electrode 110 is exposed by the CMP treatment in this manner, whereby the gate electrode 110 and the source or drain electrode 142a can be in directly contact with each other; thus, the transistor 101 and the transistor 102 can be easily electrically connected to each other.

Figure 8B:
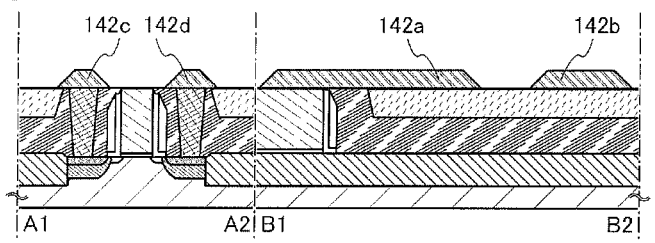

After that, a conductive layer is formed over the interlayer insulating layers 126 and 128 and is selectively etched, so that the source or drain electrode 142a, the source or drain electrode 142b, the wiring 142c, and the wiring 142d are formed (see FIG. 8B). Here, the source or drain electrode 142a, the wiring 142c, and the wiring 142d are formed so as to be in directly contact with the gate electrode 110, the source or drain electrode 130a, and the source or drain electrode 130b, respectively.

Here, for the conductive layer used for forming the source or drain electrode 142a, the source or drain electrode 142b, the wiring 142c, and the wiring 142d, a material which is the same or substantially the same as that described in Embodiment 2 can be used and description in Embodiment 2 can be referred to. Etching of the conductive layer can also be performed in a manner which is the same or substantially the same as the method described in Embodiment 2, and description in Embodiment 2 can be referred to.

Further, as in the case of Embodiment 2, an insulating layer may be formed over the source or drain electrode 142a and the source or drain electrode 142b. With the insulating layer, parasitic capacitance between a gate electrode formed later and the source or drain electrodes 142a and 142b can be reduced.

Figure 8C:
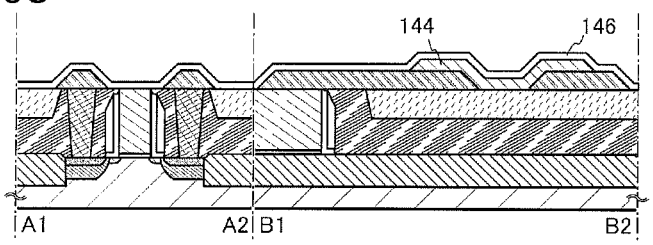

Next, an oxide semiconductor layer is formed so as to cover the source or drain electrode 142a, the source or drain electrode 142b, the wiring 142c, and the wiring 142d and the oxide semiconductor layer is selectively etched, so that the island-like oxide semiconductor layer 144 is formed in contact with the source or drain electrode 142a and the source or drain electrode 142b (see FIG. 8C).

The oxide semiconductor layer can be formed using a material and a method which are the same or substantially the same as those described in Embodiment 2. Therefore, Embodiment 2 can be referred to for a material and a formation method of the oxide semiconductor layer.

As the etching of the oxide semiconductor layer, either dry etching or wet etching may be employed. Needless to say, dry etching and wet etching can be used in combination. The etching conditions (such as an etching gas, an etchant, etching time, and temperature) are set as appropriate in accordance with the material so that the oxide semiconductor layer can be etched into a desired shape.

Further, the oxide semiconductor layer 144 is preferably subjected to heat treatment (first heat treatment) in a manner which is the same or substantially the same as that described in Embodiment 2. The first heat treatment can be performed by the method described in Embodiment 2, and Embodiment 2 can be referred to. Impurities are reduced by the first heat treatment so that the i-type (intrinsic) or substantially i-type oxide semiconductor layer 144 is obtained. Thus, a transistor having extremely excellent characteristics can be realized. Note that the first heat treatment may be performed before the oxide semiconductor layer is etched or after the oxide semiconductor layer is etched to be processed into an island shape.

Next, the gate insulating layer 146 is formed in contact with the oxide semiconductor layer 144 (see FIG. 8C).

The gate insulating layer 146 can be formed using a material and a method which are the same or substantially the same as those described in Embodiment 2. Therefore, Embodiment 2 can be referred to for a material and a formation method of the gate insulating layer 146.

After the gate insulating layer 146 is formed, second heat treatment is preferably performed in an inert gas atmosphere or an oxygen atmosphere in a manner which is the same or substantially the same as that described in Embodiment 2. The second heat treatment can be performed by the method described in Embodiment 2, and Embodiment 2 can be referred to. The second heat treatment can reduce variation in electric characteristics of the transistor. Moreover, in the case where the gate insulating layer 146 includes oxygen, oxygen is supplied to the oxide semiconductor layer 144 to compensate for oxygen deficiency in the oxide semiconductor layer 144, whereby an i-type (intrinsic) or substantially i-type oxide semiconductor layer can be formed.

Note that the second heat treatment is performed after the gate insulating layer 146 is formed in this embodiment; the timing of the second heat treatment is not particularly limited thereto. For example, the second heat treatment may be performed after the gate electrode is formed. Furthermore, the first heat treatment and the second heat treatment may be successively performed, the first heat treatment may also serve as the second heat treatment, or the second heat treatment may also serve as the first heat treatment.

Figure 8D:
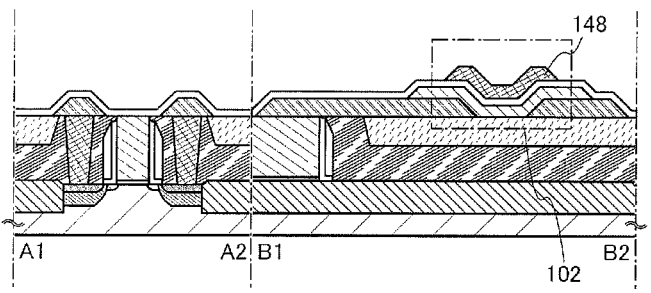

Next, over the gate insulating layer 146, the gate electrode 148 is formed in a region overlapping with the oxide semiconductor layer 144 (see FIG. 8D). The gate electrode 148 can be formed in such a manner that a conductive layer is formed over the gate insulating layer 146 and then selectively etched. The conductive layer to be the gate electrode 148 can be formed by a PVD method such as a sputtering method or a CVD method such as a plasma CVD method. The details are the same or substantially the same as those of the source or drain electrode 142a or the like; thus, the description thereof can be referred to.

Next, in a manner which is the same or substantially the same as that described in Embodiment 2, the interlayer insulating layers 150 and 152 are formed over the gate insulating layer 146 and the gate electrode 148. The interlayer insulating layers 150 and 152 can be formed using materials and methods which are the same or substantially the same as those described in Embodiment 2. Therefore, Embodiment 2 can be referred to for materials and formation methods of the interlayer insulating layers 150 and 152.

Note that the interlayer insulating layer 152 is desirably formed so as to have a planarized surface. This is because an electrode, a wiring, or the like can be favorably formed over the interlayer insulating layer 152 even in the case where the semiconductor device is miniaturized, for example. The interlayer insulating layer 152 can be planarized using a method such as CMP (chemical mechanical polishing).

Through the above steps, the transistor 102 using the highly purified oxide semiconductor layer 144 is completed (see FIG. 8D).

The transistor 102 illustrated in FIG. 8D includes the oxide semiconductor layer 144, the source or drain electrode 142a and the source or drain electrode 142b which are electrically connected to the oxide semiconductor layer 144, the gate insulating layer 146 covering the oxide semiconductor layer 144, the source or drain electrode 142a, and the source or drain electrode 142b, and the gate electrode 148 over the gate insulating layer 146.

Since the oxide semiconductor layer 144 is highly purified in the transistor 102 illustrated in this embodiment, the hydrogen concentration is $5 \times 10^{19}$ atoms/cm$^3$ or less, preferably $5 \times 10^{18}$ atoms/cm$^3$ or less, more preferably $5 \times 10^{17}$ atoms/cm$^3$ or less. In addition, the value of the carrier density of the oxide semiconductor layer 144 is sufficiently low (e.g., lower than $1 \times 10^{12}$/cm$^3$, preferably lower than $1.45 \times 10^{10}$/cm$^3$) in comparison with that of a general silicon wafer (approximately $1 \times 10^{14}$/cm$^3$). Thus, the off-state current is sufficiently low. For example, the off-state current (here, current per micrometer of channel width) of the transistor 102 at room temperature is 100 zA/μm (1 zA (zeptoampere) is $1 \times 10^{-21}$ A) or less, preferably 10 zA/μm or less.

With the use of the oxide semiconductor layer 144 which is highly purified and becomes intrinsic, the off-state current of the transistor can be sufficiently reduced. By using such a transistor, a semiconductor device in which memory data can be stored for an extremely long time can be obtained.

The structures, methods, and the like described in this embodiment can be combined as appropriate with any of the structures, methods, and the like described in the other embodiments.

Embodiment 4

In this embodiment, a structure and a manufacturing method of a semiconductor device according to another embodiment of the disclosed invention, which are different from those of Embodiments 2 and 3, will be described with reference to FIGS. 9A and 9B, FIGS. 10A to 10C, and FIGS. 11A and 11B.
<Cross-Sectional Structure and Planar Structure of Semiconductor Device>

Figure 9A:
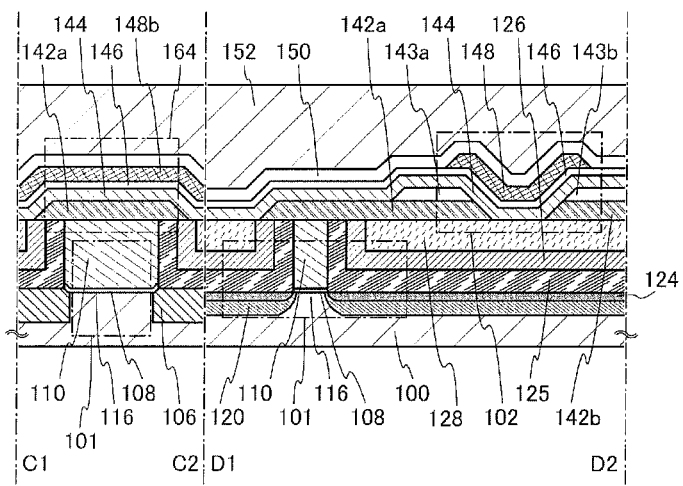
FIGS. 9A and 9B are a cross-sectional view and a plan view of a semiconductor device.
Figure 9B:
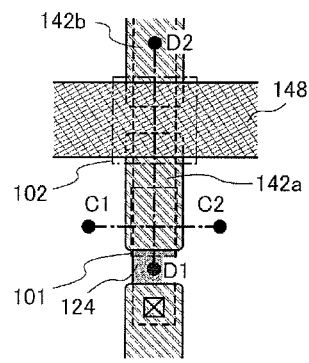

FIGS. 9A and 9B illustrate an example of a structure of the semiconductor device. FIG. 9A is a cross-sectional view of the semiconductor device, and FIG. 9B is a plan view of the semiconductor device. Here, FIG. 9A corresponds to a cross-sectional view taken along lines C1-C2 and D1-D2 of FIG. 9B. The semiconductor device illustrated in FIGS. 9A and 9B is provided with a transistor 101 including a semiconductor material other than an oxide semiconductor, and a transistor 102 including an oxide semiconductor. A transistor including a semiconductor material other than an oxide semiconductor can be operated at high speed easily. On the other hand, a transistor including an oxide semiconductor can hold charge for a long time owing to its characteristics. The transistor 101 serves as a reading transistor, and the transistor 102 serves as a writing transistor.

Although all the transistors are n-channel transistors here, it is needless to say that p-channel transistors can be used. Further, it is not necessary to limit a specific structure of a semiconductor device to the structure described here.

The semiconductor device in FIGS. 9A and 9B is different from the semiconductor devices described in the aforementioned embodiments in that the sidewall insulating layers 118 are not provided in the transistor 101. That is, the semiconductor device in FIGS. 9A and 9B does not include a sidewall insulating layer. Since a sidewall insulating layer is not formed, the impurity region 114 is not formed. Thus, in the case where the sidewall insulating layer is not provided, high integration can be easily achieved as compared to the case where the sidewall insulating layers 118 are provided. In addition, the manufacturing process can be simplified as compared to the case where the sidewall insulating layers 118 are provided.

The semiconductor device in FIGS. 9A and 9B is different from the semiconductor devices described in the aforementioned embodiments also in that an interlayer insulating layer 125 is provided in the transistor 101. That is, the semiconductor device in FIGS. 9A and 9B includes the interlayer insulating layer 125. By using an insulating layer including hydrogen as the interlayer insulating layer 125, hydrogen can be supplied to the transistor 101 and the characteristics of the transistor 101 can be improved. As the interlayer insulating layer 125, for example, a silicon nitride layer including hydrogen, which is formed by a plasma CVD method, is given. Further, by using an insulating layer in which hydrogen is sufficiently reduced as the interlayer insulating layer 126, hydrogen which might adversely affect the characteristics of the transistor 102 can be prevented from being included in the transistor 102. As the interlayer insulating layer 126, for example, a silicon nitride layer formed by a sputtering method is given. When such a structure is employed, the characteristics of the transistor 101 and the transistor 102 can be improved sufficiently.

The semiconductor device in FIGS. 9A and 9B is different from the semiconductor devices described in the aforementioned embodiments also in that an insulating layer 143a and an insulating layer 143b are provided in the transistor 102. That is, the semiconductor device in FIGS. 9A and 9B includes the insulating layer 143a and the insulating layer 143b. By thus providing the insulating layer 143a and the insulating layer 143b, so-called gate capacitance formed by the gate electrode 148 and the source or drain electrode 142a (or the gate electrode 148 and the source or drain electrode 142b) can be reduced and the operation speed of the transistor 102 can be increased.

Note that as in Embodiment 3, the source or drain electrode 142a is formed directly on the gate electrode 110, whereby the transistor 101 and the transistor 102 are electrically connected to each other. With such a structure, the integration degree is increased as compared to the case where an electrode and a wiring are provided additionally. In addition, the manufacturing process is simplified.

Although the structure including all the differences is described in this embodiment, a structure including any one of the differences may be employed.

<Manufacturing Method of Semiconductor Device>

Next, an example of a manufacturing method of the semiconductor device will be described. Steps performed after formation of the transistor 101, i.e., a manufacturing method of the transistor 102 will be described with reference to FIGS. 10A to 10C and FIGS. 11A and 11B. The transistor 101 can be manufactured by a method which is the same or substantially the same as that described in Embodiment 2. Embodiment 2 can be referred to for the details. In addition, the source or drain electrode 130a and the source or drain electrode 130b are not formed in the manufacturing process of the transistor 101 in this embodiment; however, even the structure in which the source or drain electrode 130a and the source or drain electrode 130b are not formed is called the transistor 101 for convenience.

The transistor 101 is formed by the method described in Embodiment 2 first, and then a portion of the transistor 101 over a top surface of the gate electrode 110 is removed. For the removing step, polishing treatment such as chemical mechanical polishing (CMP) treatment may be used. Thus, portions of the interlayer insulating layer 125, the interlayer insulating layer 126, and the interlayer insulating layer 128 over the top surface of the gate electrode 110 are removed. Note that the surface subjected to polishing treatment is planarized sufficiently, whereby an electrode, a wiring, an insulating layer, a semiconductor layer, and the like can be favorably formed in later steps.

Figure 10A:
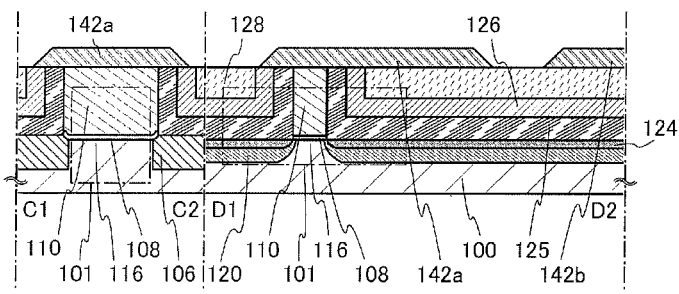
FIGS. 10A to 10C are cross-sectional views relating to a manufacturing process of a semiconductor device.

Then, a conductive layer is formed over the gate electrode 110, the interlayer insulating layer 125, the interlayer insulating layer 126, and the interlayer insulating layer 128, and the conductive layer is etched selectively, so that the source or drain electrode 142a and the source or drain electrode 142b are formed (see FIG. 10A). Here, the source or drain electrode 142a is formed so as to be in directly contact with the gate electrode 110.

The conductive layer used for forming the source or drain electrode 142a and the source or drain electrode 142b can be formed using a material which is the same or substantially the same as that described in Embodiment 2. Further, the conductive layer can be etched by a method which is the same or substantially the same as that described in Embodiment 2. Embodiment 2 can be referred to for the details.

Figure 10B:
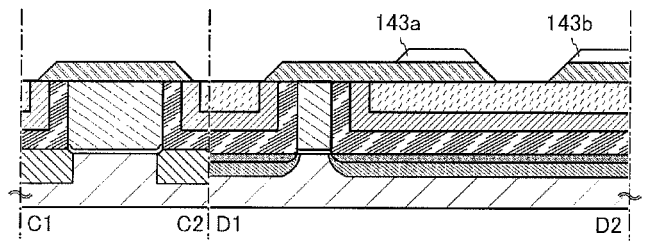

Next, an insulating layer is formed so as to cover the source or drain electrode 142a and the source or drain electrode 142b and etched selectively, so that the insulating layer 143a and the insulating layer 143b are formed over the source or drain electrode 142a and the source or drain electrode 142b, respectively (see FIG. 10B).

With the insulating layer 143a and the insulating layer 143b, parasitic capacitance between a gate electrode formed later and the source or drain electrodes 142a and 142b can be reduced.

Figure 10C:
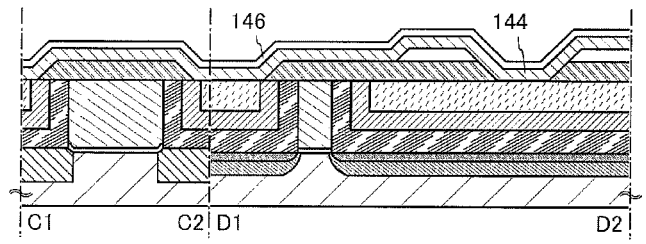

After that, the oxide semiconductor layer 144 is formed so as to cover the source or drain electrode 142a and the source or drain electrode 142b, and the gate insulating layer 146 is formed over the oxide semiconductor layer 144 (see FIG. 10C).

The oxide semiconductor layer 144 can be formed using the material and the method described in Embodiment 2. Further, the oxide semiconductor layer 144 is preferably subjected to heat treatment (first heat treatment). Embodiment 2 can be referred to for the details.

The gate insulating layer 146 can be formed using the material and the method described in Embodiment 2. After the gate insulating layer 146 is formed, heat treatment (second heat treatment) is preferably performed in an inert gas atmosphere or an oxygen atmosphere. Embodiment 2 can be referred to for the details.

Figure 11A:
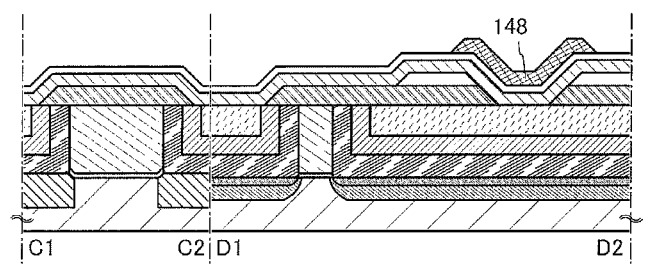
FIGS. 11A and 11B are cross-sectional views relating to a manufacturing process of a semiconductor device.

Then, over the gate insulating layer 146, the gate electrode 148 is formed in a region overlapping with a region of the transistor 102, which serves as a channel formation region (see FIG. 11A).

The gate electrode 148 can be formed in such a manner that a conductive layer is formed over the gate insulating layer 146 and then selectively etched. The conductive layer to be the gate electrode 148 can be formed by a PVD method such as a sputtering method or a CVD method such as a plasma CVD method. The details are the same or substantially the same as those of the source or drain electrode 142a or the like; thus, the description thereof can be referred to.

Figure 11B:
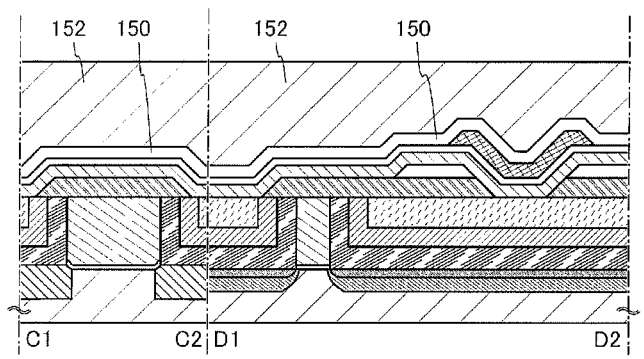

Next, the interlayer insulating layers 150 and 152 are formed over the gate insulating layer 146 and the gate electrode 148 (see FIG. 11B). The interlayer insulating layers 150 and 152 can be formed using the materials and the methods described in Embodiment 2. Embodiment 2 can be referred to for the details.

Note that the interlayer insulating layer 152 is preferably formed so as to have a planarized surface. By forming the interlayer insulating layer 152 so as to have a planarized surface, an electrode, a wiring, or the like can be favorably formed over the interlayer insulating layer 152 even in the case where the semiconductor device is reduced in size, for example. The interlayer insulating layer 152 can be planarized by a method such as chemical mechanical polishing (CMP).

Through the above steps, the semiconductor device including the transistor 101 and the transistor 102 is completed.

In the semiconductor device described in this embodiment, the transistor 102 overlaps with the transistor 101, the transistor 101 does not include a sidewall insulating layer, and the source or drain electrode 142a is formed directly on the gate electrode 110, for example; thus, high integration is possible. Further, the manufacturing process is simplified.

Further, in the semiconductor device described in this embodiment, an insulating layer including hydrogen and an insulating layer in which hydrogen is sufficiently reduced are used as the interlayer insulating layer 125 and the interlayer insulating layer 126, respectively; thus, the characteristics of the transistor 101 and the transistor 102 are improved. Owing to the insulating layer 143a and the insulating layer 143b, so-called gate capacitance is reduced and thus the operation speed of the transistor 102 is increased.

The above features described in this embodiment make it possible to provide a semiconductor device having significantly excellent characteristics.

The structures, methods, and the like described in this embodiment can be combined as appropriate with any of the structures, methods, and the like described in the other embodiments.

Embodiment 5

In this embodiment, application of the semiconductor device described in any of the aforementioned embodiments to an electronic device is described with reference to FIGS. 12A to 12F. In this embodiment, application of the above-described semiconductor device to electronic devices such as a computer, a cellular phone (also referred to as a mobile phone or a mobile phone set), a personal digital assistant (including a portable game machine, an audio reproducing device, and the like), a digital camera, a digital video camera, electronic paper, and a television set (also referred to as a television or a television receiver) is described.

Figure 12A:
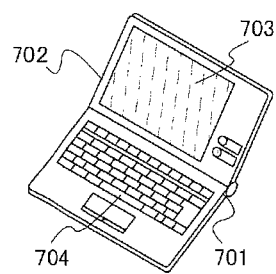
FIGS. 12A to 12F each illustrate an electronic device including a semiconductor device.

FIG. 12A illustrates a laptop personal computer that includes a housing 701, a housing 702, a display portion 703, a keyboard 704, and the like. In each of the housings 701 and 702, the semiconductor device described in any of the above embodiments is provided. Therefore, a laptop personal computer in which writing and reading of data are performed at high speed, data is stored for a long time, and power consumption is sufficiently reduced can be realized.

Figure 12D:
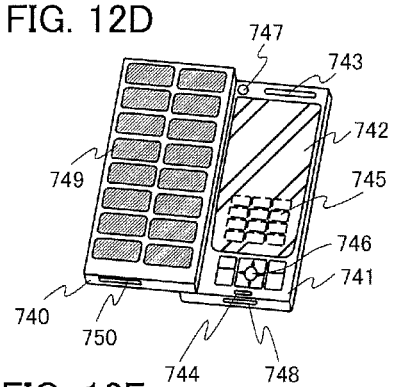
Figure 12B:
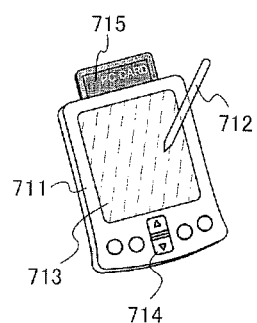

FIG. 12B illustrates a personal digital assistant (PDA). In a main body 711, a display portion 713, an external interface 715, an operation button 714, and the like are provided. Further, a stylus 712 and the like for operation of the personal digital assistant are provided. In the main body 711, the semiconductor device described in any of the above embodiments is provided. Therefore, a personal digital assistant in which writing and reading of data are performed at high speed, data can be stored for a long time, and power consumption is sufficiently reduced can be realized.

Figure 12E:
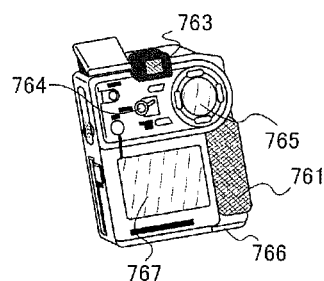
Figure 12C:
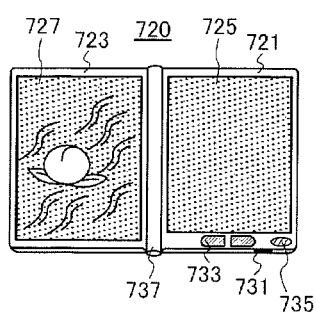

FIG. 12C illustrates an e-book reader 720 mounted with electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power button 731, an operation key 733, a speaker 735, and the like. At least one of the housings 721 and 723 is provided with the semiconductor device described in any of the above embodiments. Therefore, an e-book reader in which writing and reading of data are performed at high speed, data can be stored for a long time, and power consumption is sufficiently reduced can be realized.

FIG. 12D illustrates a mobile phone which includes two housings, a housing 740 and a housing 741. Moreover, the housings 740 and 741 in a state where they are developed as illustrated in FIG. 12D can be slid so that one is lapped over the other; therefore, the size of the mobile phone can be reduced, which makes the mobile phone suitable for being carried. The housing 741 includes a display panel 742, a speaker 743, a microphone 744, a touch screen 745, a pointing device 746, a camera lens 747, an external connection terminal 748, and the like. The housing 740 includes a solar cell 749 for charging the mobile phone, an external memory slot 750, and the like. In addition, all antenna is incorporated in the housing 741. At least one of the housings 740 and 741 is provided with the semiconductor device described in any of the above embodiments. Therefore, a mobile phone in which writing and reading of data are performed at high speed, data can be stored for a long time, and power consumption is sufficiently reduced can be realized.

FIG. 12E illustrates a digital camera which includes a main body 761, a display portion 767, an eyepiece 763, an operation switch 764, a display portion 765, a battery 766, and the like. In the main body 761, the semiconductor device described in any of the above embodiments is provided. Therefore, a digital camera in which writing and reading of data are performed at high speed, data can be stored for a long time, and power consumption is sufficiently reduced can be realized.

Figure 12F:
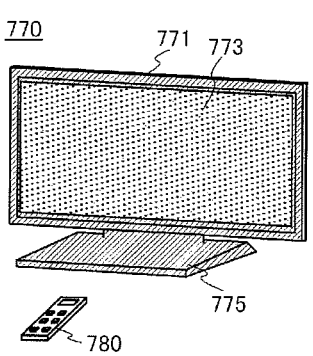

FIG. 12F illustrates a television set 770 which includes a housing 771, a display portion 773, a stand 775, and the like. The television set 770 can be operated with an operation switch of the housing 771 or a remote controller 780. The semiconductor device described in any of the above embodiments is mounted on the housing 771 and the remote controller 780. Therefore, a television set in which writing and reading of data are performed at high speed, data can be stored for a long time, and power consumption is sufficiently reduced can be realized.

As described above, the semiconductor device in any of the above embodiments is mounted on each of the electronic devices described in this embodiment. Therefore, electronic devices in which power consumption is reduced can be realized.

Example 1

In this example, results obtained by measuring the off-state current of a transistor including a highly purified oxide semiconductor will be described with reference to FIG. 13, FIG. 14, FIG. 15, FIG. 16, and FIG. 17.

Figure 13:
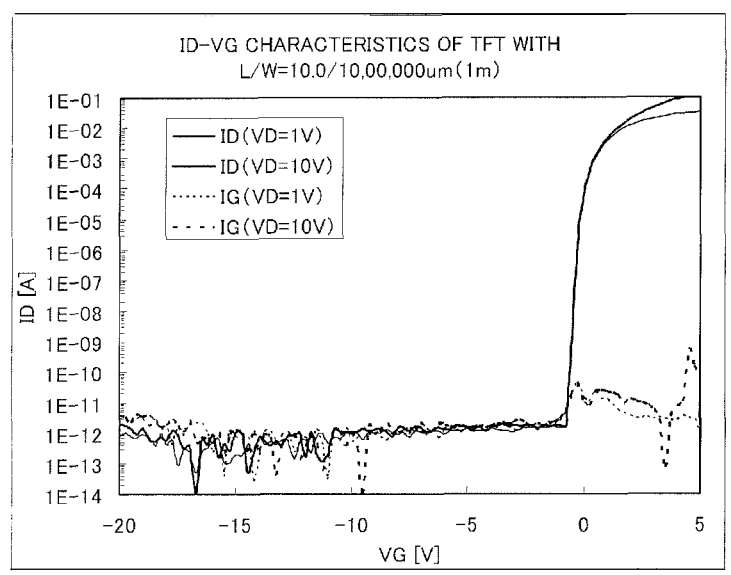
FIG. 13 is a graph showing characteristics of a transistor including an oxide semiconductor.

First, a transistor with a channel width W of 1 m, which was sufficiently wide, was prepared in consideration of the very small off-state current of a transistor including a highly purified oxide semiconductor, and the off-state current was measured. FIG. 13 shows the results obtained by measurement of the off-state current of the transistor with a channel width W of 1 m. In FIG. 13, the horizontal axis shows a gate voltage VG and the vertical axis shows a drain current ID. In the case where the drain voltage VD is +1 V or +10 V and the gate voltage VG is within the range of −5 V to −20 V, the off-state current of the transistor was found to be smaller than or equal to $1 \times 10^{-13}$ A which is the detection limit. Moreover, it was found that the off-state current of the transistor (per unit channel width (1 μm)) is smaller than or equal to 1 aA/μm ($1 \times 10^{-18}$ A/μm).

Next will be described the results obtained by measuring the off-state current of the transistor including a highly purified oxide semiconductor more accurately. As described above, the off-state current of the transistor including a highly purified oxide semiconductor was found to be smaller than or equal to $1 \times 10^{-13}$ A which is the measurement limit of measurement equipment. Here, the results obtained measuring more accurate off-state current (the value smaller than or equal to the detection limit of measurement equipment in the above measurement), with the use of an element for characteristic evaluation, will be described.

First, the element for characteristic evaluation will be described with reference to FIG. 14.

Figure 14:
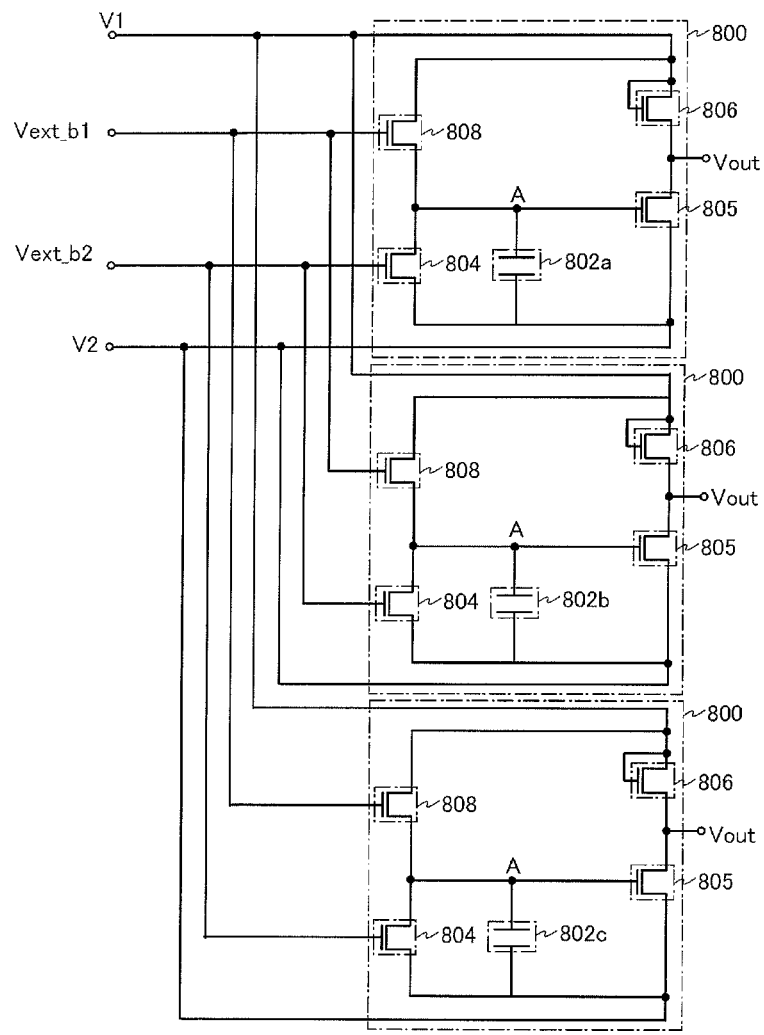
FIG. 14 is a circuit diagram for evaluating characteristics of a transistor including an oxide semiconductor.

In the element for characteristic evaluation in FIG. 14, three measurement systems 800 are connected in parallel. Each measurement system 800 includes a capacitor 802, a transistor 804, a transistor 805, a transistor 806, and a transistor 808. A transistor including a highly purified oxide semiconductor was used as each of the transistors 804, 805, and 806.

In the measurement system 800, one of a source terminal and a drain terminal of the transistor 804, one of terminals of the capacitor 802, and one of a source terminal and a drain terminal of the transistor 805 are connected to a power source (for supplying V2). The other of the source terminal and the drain terminal of the transistor 804, one of a source terminal and a drain terminal of the transistor 808, the other of the terminals of the capacitor 802, and a gate terminal of the transistor 805 are connected to one another. The other of a source terminal and a drain terminal of the transistor 808, one of a source terminal and a drain terminal of the transistor 806, and a gate terminal of the transistor 806 are connected to a power source (for supplying V1). The other of the source terminal and the drain terminal of the transistor 805, the other of the source terminal and the drain terminal of the transistor 806 are each electrically connected to an output terminal.

A potential Vext_b2 for controlling an on state and an off state of the transistor 804 is supplied to the gate terminal of the transistor 804. A potential Vext_b1 for controlling an on state and an off state of the transistor 808 is supplied to the gate terminal of the transistor 808. A potential Vout is output from the output terminal.

Next, a method for measuring current with the use of the element for characteristic evaluation will be described.

First, an initialization period in which a potential difference is applied to measure the off-state current will be described briefly. In the initialization period, the potential Vext_b1 for turning on the transistor 808 is input to the gate terminal of the transistor 808, and a potential V1 is supplied to a node A that is a node connected to the other of the source terminal and the drain terminal of the transistor 804 (that is, the node connected to one of the source terminal and the drain terminal of the transistor 808, the other of the terminals of the capacitor 802, and the gate terminal of the transistor 805). Here, the potential V1 is, for example, a high potential. The transistor 804 is off.

After that, the potential Vext_b1 for turning off the transistor 808 is input to the gate terminal of the transistor 808 so that the transistor 808 is turned off. After the transistor 808 is turned off, the potential V1 is set to low. Still, the transistor 804 is off. The potential V2 is the same potential as V1. Thus, the initialization period is completed. In a state where the initialization period is completed, a potential difference is generated between the node A and one of the source terminal and the drain terminal of the transistor 804, and also, a potential difference is generated between the node A and the other of the source terminal and the drain terminal of the transistor 808. Therefore, charge flows slightly through the transistor 804 and the transistor 808. In other words, an off-state current is generated.

Next, a measurement period of the off-state current will be described briefly. In the measurement period, the potential (that is, V2) of one of the source terminal and the drain terminal of the transistor 804 and the potential (that is, V1) of the other of the source terminal and the drain terminal of the transistor 808 are set to low and fixed. On the other hand, the potential of the node A is not fixed (the node A is in a floating state) in the measurement period. Thus, charge flows through the transistor 804 and the amount of charge held in the node A is changed as time goes by. Further, as the amount of charge held in the node A is changed, the potential of the node A varies. That is to say, the output potential Vout of the output terminal also varies.

Figure 15:
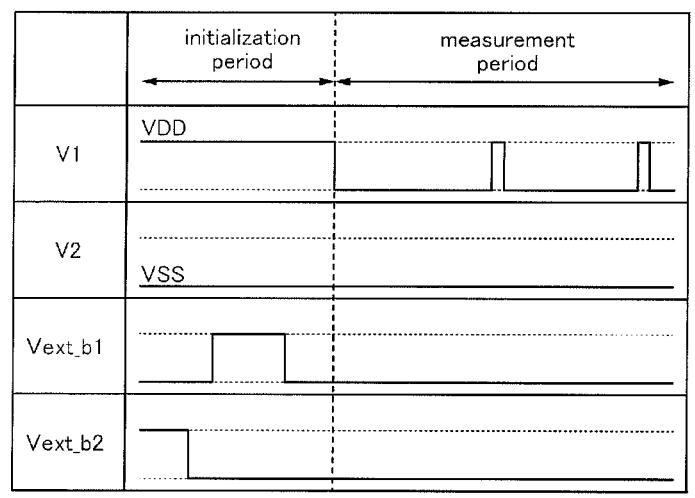
FIG. 15 is a timing chart for evaluating characteristics of a transistor including an oxide semiconductor.

FIG. 15 shows details of the relation between potentials in the initialization period in which the potential difference is applied and in the following measurement period (timing chart).

In the initialization period, first, the potential Vext_b2 is set to a potential (high potential) at which the transistor 804 is turned on. Thus, the potential of the node A comes to be V2, that is, a low potential (VSS). After that, the potential Vext_b2 is set to a potential (low potential) at which the transistor 804 is turned off, whereby the transistor 804 is turned off. Then, the potential Vext_b1 is set to a potential (high potential) at which the transistor 808 is turned on. Thus, the potential of the node A comes to be V1, that is, a high potential (VDD). After that, the potential Vext_b1 is set to a potential at which the transistor 808 is turned off. Accordingly, the node A is brought into a floating state and the initialization period is completed.

In the following measurement period, the potential V1 and the potential V2 are individually set to potentials at which charge flow to or from the node A. Here, the potential V1 and the potential V2 are low potentials (VSS). Note that at the timing of measuring the output potential Vout, it is necessary to operate an output circuit; thus, V1 is set to a high potential (VDD) temporarily in some cases. The period in which V1 is a high potential (VDD) is set to be short so that the measurement is not influenced.

When a potential difference is applied as described above to start the measurement period, the amount of charge held in the node A is changed as time passes and accordingly, the potential of the node A varies. This means that the potential of a gate terminal of the transistor 805 varies and thus, the output potential Vout of the output terminal also varies with the lapse of time.

A method for calculating the off-state current based on the obtained output potential Vout will be described below.

The relation between the potential $V_A$ of the node A and the output potential Vout is obtained in advance before the off-state current is calculated. Thus, the potential $V_A$ of the node A can be obtained based on the output potential Vout. From the relation described above, the potential $V_A$ of the node A can be expressed by the following equation as a function of the output potential Vout.

$$V_A = F(Vout)$$

Charge $Q_A$ of the node A is expressed by the following equation, using the potential $V_A$ of the node A, capacitance $C_A$ connected to the node A, and a constant (const). Here, the capacitance $C_A$ connected to the node A is the sum of capacitance of the capacitor 802 and the other capacitance.

$$Q_A = C_A V_A + \mathrm{const}$$

Since a current $I_A$ of the node A is obtained by differentiating charge flowing to the node A (or charge flowing from the node A) with respect to time, the current $I_A$ of the node A is expressed by the following equation.

$$I_A \equiv \frac{\Delta Q_A}{\Delta t} = \frac{C_A \cdot \Delta F(Vout)}{\Delta t}$$

Thus, the current $I_A$ of the node A can be obtained based on the capacitance $C_A$ connected to the node A and the output potential Vout of the output terminal.

By the method described above, a leakage current (off-state current) flowing between the source and the drain of the transistor which is off can be calculated.

In this example, the transistor 804, the transistor 805, the transistor 806, and the transistor 808 were fabricated using a highly purified oxide semiconductor with a channel length L of 10 μm and a channel width W of 50 μm. In each of the measurement systems 800 arranged in parallel, capacitance values of capacitors 802a, 802b, and 802c were 100 fF, 1 pF, and 3 pF, respectively.

Note that the measurement according to this example was performed assuming that VDD=5 V and VSS=0 V are satisfied. In the measurement period, the potential V1 was basically set to VSS and set to VDD only in a period of 100 msec every 10 to 300 seconds, and Vout was measured. Further, Δt used when the current I flowing through an element was about 30,000 seconds.

Figure 16:
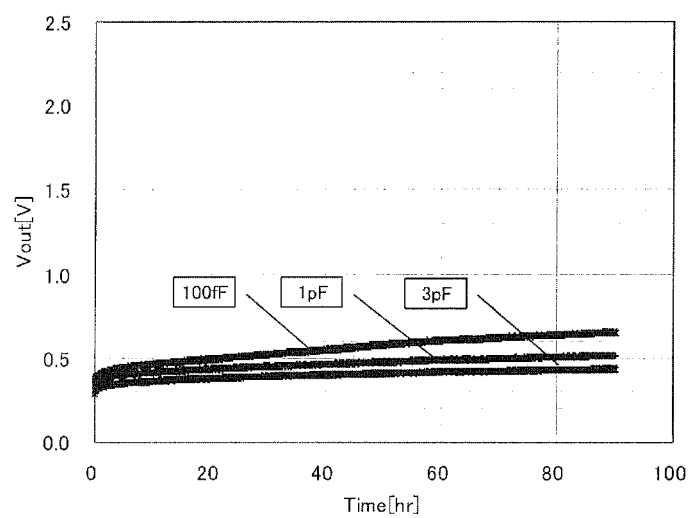
FIG. 16 is a graph showing characteristics of a transistor including an oxide semiconductor.

FIG. 16 shows the relation between the output potential Vout and elapsed time Time in the current measurement. The potential change can be observed after about 90 hours.

Figure 17:
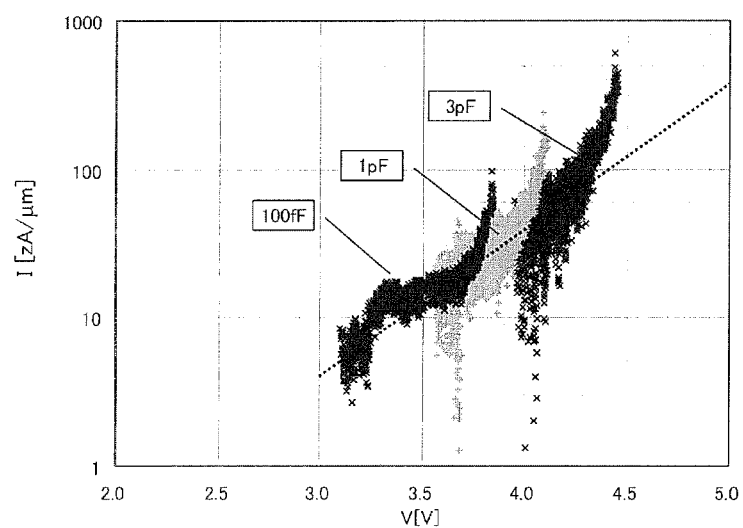
FIG. 17 is a graph showing characteristics of a transistor including an oxide semiconductor.

FIG. 17 shows the off-state current calculated based on the above current measurement. Note that FIG. 17 shows the relation between a source-drain voltage V and an off-state current I. According to FIG. 17, an off-state current was about 40 zA/μm, where the source-drain voltage is 4 V. When the source-drain voltage was 3 V, the off-state current was smaller than or equal to 4 zA/μm. Note that 1 zA is equivalent to $10^{-21}$ A.

According to this example, it was confirmed that the off-state current can be sufficiently small in a transistor including a highly purified oxide semiconductor.

This application is based on Japanese Patent Application serial no. 2010-024886 filed with Japan Patent Office on Feb. 5, 2010, the entire contents of which are hereby incorporated by reference.

The invention claimed is:

1. A semiconductor device comprising:
a first memory cell and a second memory cell, each of the first memory cell and the second memory cell including a first transistor and a second transistor; each of the first transistor and the second transistor in each of the first memory cell and the second memory cell comprising a gate, a source and a drain;
a first wiring electrically connected to one of the source and the drain of the first transistor of the first memory cell and one of the source and the drain of the first transistor of the second memory cell;
a second wiring electrically connected to the other of the source and the drain of the first transistor of the first memory cell and one of the source and the drain of the second transistor of the first memory cell;
a third wiring electrically connected to the other of the source and the drain of the first transistor of the second memory cell and one of the source and the drain of the second transistor of the second memory cell; and
a fourth wiring electrically connected to the gate of the second transistor of the first memory cell and the gate of the second transistor of the second memory cell,
wherein in each of the first memory cell and the second memory cell, the other of the source and the drain of the second transistor is electrically connected to the gate of the first transistor.

2. The semiconductor device according to claim 1, wherein the second transistor in each of the first memory cell and the second memory cell comprises an oxide semiconductor.

3. The semiconductor device according to claim 1, wherein an off-state current of the second transistor in each of the first memory cell and the second memory cell is lower than an off-state current of the first transistor.

4. The semiconductor device according to claim 1, wherein in each of the first memory cell and the second memory cell, a switching speed of the first transistor is higher than a switching speed of the second transistor.

5. A semiconductor device comprising:
a reading signal line;
a plurality of bit lines;
a word line;
a first driving circuit electrically connected to the reading signal line;
a second driving circuit electrically connected to the plurality of bit lines;
a third driving circuit electrically connected to the word line; and
a plurality of memory cells,
each of the plurality of memory cells comprising:
a first transistor and a second transistor; each of the first transistor and the second transistor comprising a gate, a source and a drain;
wherein one of the source and the drain of the first transistor is electrically connected to the reading signal line,
wherein one of the source and the drain of the second transistor is electrically connected to the gate of the first transistor,
wherein the other of the source and the drain of the first transistor and the other of the source and the drain of the second transistor are electrically connected to one of the plurality of bit lines, and
wherein the gate of the second transistor is electrically connected to the word line.

6. The semiconductor device according to claim 5, wherein the second transistor comprises an oxide semiconductor.

7. The semiconductor device according to claim 5, wherein an off-state current of the second transistor is lower than an off-state current of the first transistor.

8. The semiconductor device according to claim 5, wherein a switching speed of the first transistor is higher than a switching speed of the second transistor.

9. A method for driving a semiconductor device comprising:
a memory cell including a first transistor and a second transistor; each of the first transistor and the second transistor comprising a gate, a source and a drain;
a first wiring electrically connected to one of the source and the drain of the first transistor; and
a second wiring electrically connected to the other of the source and the drain of the first transistor and one of the source and the drain of the second transistor,
wherein the other of the source and the drain of the second transistor is electrically connected to the gate of the first transistor,
the method for driving the semiconductor device comprising the steps of:
in a state where the first transistor is in an off state, turning on the second transistor,
applying a high-level potential or a low-level potential which is supplied to the second wiring, to the gate of the first transistor; and
turning off the second transistor, whereby a potential of the gate of the first transistor is held.

10. The method for driving a semiconductor device according to claim 9, wherein a difference between the high-level potential and the low-level potential which are supplied to the second wiring is smaller than a threshold voltage of the first transistor.

11. A method for driving a semiconductor device comprising:
a memory cell including a first transistor and a second transistor; each of the first transistor and the second transistor comprising a gate, a source and a drain;
a first wiring electrically connected to one of the source and the drain of the first transistor; and
a second wiring electrically connected to the other of the source and the drain of the first transistor and one of the source and the drain of the second transistor,
wherein the other of the source and the drain of the second transistor is electrically connected to the gate of the first transistor,
the method for driving the semiconductor device comprising the steps of:
turning off the second transistor;
setting the second wiring at a second potential and then setting the first wiring at a first potential; and
detecting on or off of the first transistor.

12. The method for driving a semiconductor device according to claim 11, wherein the first potential is different from the second potential.

* * * * *

UNITED STATES PATENT AND TRADEMARK OFFICE
CERTIFICATE OF CORRECTION

PATENT NO. : 8,493,766 B2  
APPLICATION NO. : 13/019334  
DATED : July 23, 2013  
INVENTOR(S) : Daisuke Kawae Page 1 of 1

It is certified that error appears in the above-identified patent and that said Letters Patent is hereby corrected as shown below:

In the Specification

Column 8, line 7, in [Formula 4] replace "$V_{RLL}-V_{RLL}<V_{th1}$" with --$V_{BLL}-V_{RLL}<V_{th1}$--;

Column 31, line 46, replace "all" with --an--.

Signed and Sealed this  
Eleventh Day of February, 2014

Michelle K. Lee  
*Deputy Director of the United States Patent and Trademark Office*